US012585191B2

(12) United States Patent
Ryu et al.

(10) Patent No.: US 12,585,191 B2
(45) Date of Patent: Mar. 24, 2026

(54) PHOTOLITHOGRAPHY APPARATUS AND METHOD FOR FORMING PHOTORESIST PATTERN

(71) Applicant: Samsung Display Co., LTD., Yongin-si (KR)

(72) Inventors: Yong Hwan Ryu, Yongin-si (KR); Sang Jin Park, Yongin-si (KR); Sa Rah Lee, Cheonan-si (KR); Sung Bae Ju, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 742 days.

(21) Appl. No.: 17/691,074

(22) Filed: Mar. 9, 2022

(65) Prior Publication Data

US 2023/0024754 A1      Jan. 26, 2023

(30) Foreign Application Priority Data

Jul. 20, 2021     (KR) ........................ 10-2021-0095000

(51) Int. Cl.
*G03F 7/16*          (2006.01)
*H10P 72/00*          (2026.01)

(52) U.S. Cl.
CPC .......... *G03F 7/168* (2013.01); *H10P 72/0474* (2026.01)

(58) Field of Classification Search
CPC ............. G03F 7/168; G03F 7/16; G03F 7/162
See application file for complete search history.

(56) References Cited

U.S. PATENT DOCUMENTS

| | | | | |
|---|---|---|---|---|
| 6,015,759 A | * | 1/2000 | Khan | .................. C23C 16/0236 257/E21.549 |
| 2004/0187786 A1 | * | 9/2004 | Tanaka | .............. H01L 21/67017 118/719 |
| 2007/0280680 A1 | * | 12/2007 | Kim | .................. H01L 21/67727 118/66 |

FOREIGN PATENT DOCUMENTS

| | | | | |
|---|---|---|---|---|
| JP | 2004-214433 A | * | 7/2004 | ............... H05K 1/16 |
| KR | 1020050066017 A | | 6/2005 | |
| KR | 1020090126568 A | | 12/2009 | |
| KR | 100949505 B1 | | 3/2010 | |
| KR | 1020150045813 A | | 4/2015 | |

OTHER PUBLICATIONS

English Translation of JP2004-214433A (Year: 2004).*

* cited by examiner

*Primary Examiner* — Daborah Chacko-Davis
(74) *Attorney, Agent, or Firm* — CANTOR COLBURN LLP

(57)          ABSTRACT

A photolithography apparatus includes a cleaning unit which cleans a target substrate, a drying unit which dries the target substrate provided from the cleaning unit, and a coating unit which forms a photoresist layer by coating a photoresist on the target substrate provided from the drying unit. The drying unit includes a first vacuum unit which performs a vacuum treatment on the target substrate.

20 Claims, 22 Drawing Sheets

FIG. 2

CL1: GAT1
CL2: GAT2
CL3: GAT3
CL4: SD1a, SD1b, SD2a, SD2b
CL5: CTE

CL1: GAT1
CL2: GAT2
CL4: SD1a, SD1b
CL5: CTE

S11

Cleaning target substrate

S21

Drying the target substrate, including vacuum treatment

S31

Forming photoresist layer on target substrate

S41

Partially exposing photoresist layer

S51

Developing photoresist layer to form photoresist pattern

PHOTOLITHOGRAPHY APPARATUS AND METHOD FOR FORMING PHOTORESIST PATTERN

This application claims priority to Korean Patent Application No. 10-2021-0095000, filed on Jul. 20, 2021, and all the benefits accruing therefrom under 35 U.S.C. § 119, the content of which in its entirety is herein incorporated by reference.

BACKGROUND

1. Field

Embodiments of the invention relate to a photolithography apparatus and a method for forming a photoresist pattern.

2. Description of the Related Art

The importance of display devices has steadily increased with the development of multimedia technology. Accordingly, various types of display devices such as a liquid crystal display ("LCD") device, an organic light emitting display ("OLED") device and the like have been widely used in various fields.

The display device typically includes various patterns disposed on a substrate. The patterns may be electrodes, wires, semiconductor patterns and the like, and may be formed through a photolithography process.

SUMMARY

Embodiments of the invention provide a photolithography apparatus and a method for forming a photoresist pattern, defects in the photolithography process are reduced through vacuum treatment to remove foreign substances disposed in cracks included in a target substrate before applying a photoresist.

An embodiment of the invention provides a photolithography apparatus including a cleaning unit which cleans a target substrate, a drying unit which dries the target substrate provided from the cleaning unit, and a coating unit which forms a photoresist layer by coating a photoresist on the target substrate provided from the drying unit. In such an embodiment, the drying unit includes a first vacuum unit which performs a vacuum treatment on the target substrate.

In an embodiment, the drying unit may further include a first heating unit which heats the target substrate and a first cooling unit which cools the target substrate heated by the first heating unit.

In an embodiment, the first vacuum unit may be disposed between the first cooling unit and the coating unit.

In an embodiment, the first vacuum unit may be disposed between the first heating unit and the first cooling unit.

In an embodiment, the first vacuum unit may be disposed between the cleaning unit and the first heating unit.

In an embodiment, the photolithography apparatus may further include a curing unit which cures the photoresist layer of the target substrate provided from the coating unit, an exposure unit which radiates light after disposing a mask on the photoresist layer of the target substrate provided from the curing unit, and a developing unit which forms a photoresist pattern by developing the photoresist layer of the target substrate provided from the exposure unit.

In an embodiment, the curing unit may include a second vacuum unit which performs a vacuum treatment on the target substrate, a second heating unit which heats the target substrate provided from the second vacuum unit, and a second heating unit which cools the target substrate provided from the second heating unit.

In an embodiment, the first vacuum unit may include a chamber, a stage disposed inside the chamber, and a vacuum pump which provides a negative pressure to an inner space of the chamber.

In an embodiment, the first vacuum unit may further include a heater coupled to the stage.

In an embodiment, the first vacuum unit may further include a cooler coupled to the stage.

In an embodiment, the cleaning unit may include a cleaning solution sprayer which sprays a cleaning solution onto the target substrate and an air sprayer which sprays air onto the target substrate provided from the cleaning solution sprayer.

In an embodiment, the target substrate may include a base substrate, a first conductive layer disposed on the base substrate, a first insulating layer disposed on the first conductive layer, and a second conductive layer disposed on the first insulating layer and overlapping the first conductive layer. In such an embodiment, an edge of the first conductive layer and an edge of the second conductive layer may be aligned with each other.

In an embodiment, the target substrate further includes a second insulating layer disposed on the second conductive layer. In such an embodiment, the second insulating layer may include a crack disposed adjacent to the edge of the first conductive layer and the edge of the second conductive layer, which are aligned with each other.

In an embodiment, an alignment angle between one surface of the base substrate and an imaginary line connecting the edge of the first conductive layer and the edge of the second conductive layer, which are aligned with each other, in the target substrate may be in a range of about 80° to about 100°.

An embodiment of the invention provides a method of forming a photoresist pattern, including cleaning a target substrate, drying the target substrate, and forming a photoresist layer by applying a photoresist on the target substrate. In such an embodiment, the drying the target substrate comprises performing a vacuum treatment on the target substrate.

In an embodiment, The drying of the target substrate may further include heating the target substrate. In such an embodiment, the heating the target substrate may be performed before the performing the vacuum treatment on the target substrate.

In an embodiment, the drying the target substrate may further include heating the target substrate. In such an embodiment, the heating the target substrate may be performed after the performing the vacuum treatment on the target substrate.

In an embodiment, the method may further include, after forming the photoresist layer on the target substrate, curing the photoresist layer, radiating light after disposing a mask on the photoresist layer, and developing the photoresist layer to form a photoresist pattern.

In an embodiment, the target substrate may include a base substrate, a first conductive layer disposed on the base substrate, a first insulating layer disposed on the first conductive layer, and a second conductive layer disposed on the first insulating layer and overlapping the first conductive layer. In such an embodiment, an edge of the first conductive layer and an edge of the second conductive layer may be aligned with each other.

In an embodiment, the target substrate may further include a second insulating layer disposed on the second conductive layer. In such an embodiment, the second insulating layer may include a crack disposed adjacent to the edge of the first conductive layer and the edge of the second conductive layer, which are aligned with each other.

According to embodiments of the invention, defects in the photolithography process may be reduced by removing foreign substances disposed in cracks included in a substrate through a vacuum treatment before applying a photoresist.

BRIEF DESCRIPTION OF THE DRAWINGS

These and/or other features of the invention will become apparent and more readily appreciated from the following description of the embodiments, taken in conjunction with the accompanying drawings, in which:

FIG. 2 is a cross-sectional view of one pixel of a display device according to an embodiment;

DETAILED DESCRIPTION

Figure 1A:
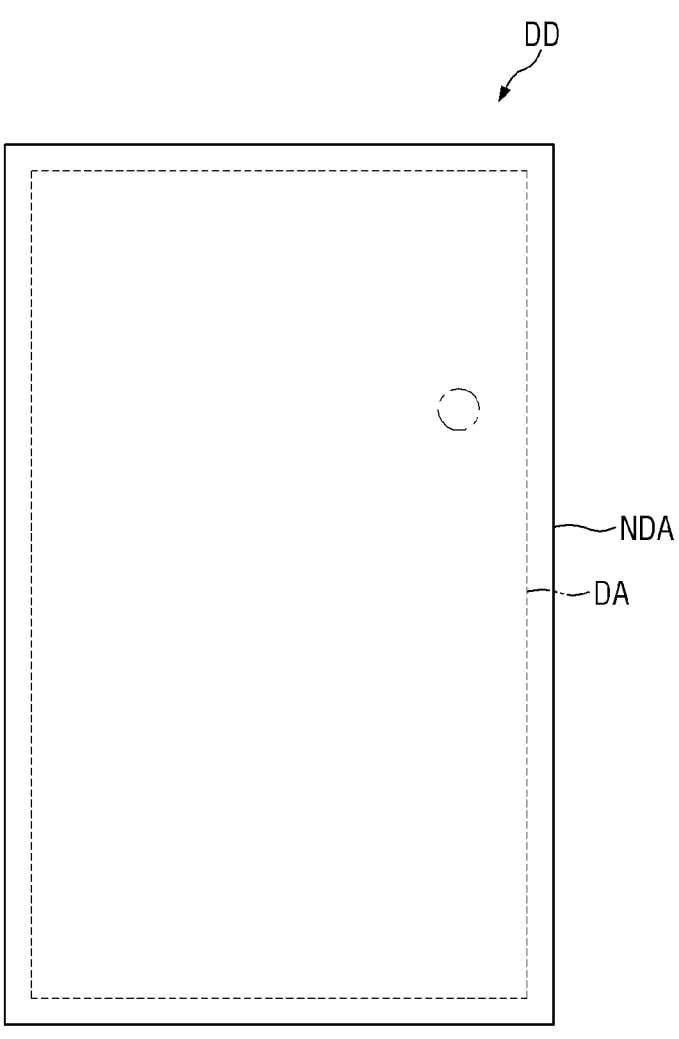
FIG. 1A is a plan view of a display device according to an embodiment.

Embodiments of the invention will now be described more fully hereinafter with reference to the accompanying drawings, in which embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached drawing figures, the thickness of layers and regions is exaggerated for clarity. As used herein, a same reference number may indicate a singular element or a plurality of the element. For example, a reference number labeling a singular form of an element within the drawing figures may be used to reference a plurality of the element within the text of specification.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

It will also be understood that when a layer is referred to as being related to another element such as being "on" another layer or substrate, it can be directly on the other layer or substrate, or intervening layers may also be present. In contrast, when an element is referred to as being related to another element such as being "directly on" another element, there are no intervening elements present.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." "At least one of A and B" means "A and/or B." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. A region illustrated or described as flat may, typically, have rough and/or nonlinear features, for example. Moreover, sharp angles that are illustrated may be rounded. Thus, the regions illustrated in the drawing figures are schematic in nature and their shapes are not intended to illustrate the precise shape of a region and are not intended to limit the scope of the claims.

Hereinafter, embodiments of the invention will be described in detail with reference to the accompanying drawings.

Figure 1B:
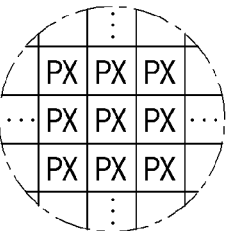
FIG. 1B is an enlarged view of the encircled portion of FIG. 1A.

FIG. 1A is a plan view of a display device according to an embodiment, and FIG. 1B is an enlarged view of the encircled portion of FIG. 1A.

Referring to FIG. 1A, an embodiment of a display device DD displays a moving image or a still image. The display device DD may refer to any electronic device providing a display screen. In an embodiment, for example, the display device DD may include a television, a laptop computer, a monitor, a billboard, an Internet-of-Things device, a mobile phone, a smartphone, a tablet personal computer ("PC"), an electronic watch, a smart watch, a watch phone, a head-mounted display, a mobile communication terminal, an electronic notebook, an electronic book, a portable multimedia player ("PMP"), a navigation device, a game machine, a digital camera, a camcorder and the like, which provide a display screen.

In an embodiment, the display device DD includes a display panel which provides a display screen. In an embodiment, for example, the display panel may include an inorganic light emitting diode display panel, an organic light emitting display panel, a quantum dot light emitting display panel, a plasma display panel and a field emission display panel. Hereinafter, embodiments where an inorganic light emitting diode display panel is applied as a display panel will be described in detail for convenience of description, but the disclosure is not limited thereto, and other types of display panel may be applied within the same scope of technical spirit.

The shape of the display device DD may be variously modified. In an embodiment, for example, the display device DD may have a shape such as a rectangular shape elongated in a horizontal direction, a rectangular shape elongated in a vertical direction, a square shape, a quadrilateral shape with rounded corners (vertices), other polygonal shapes and a circular shape. The shape of a display area DA of the display device DD may also be similar to the overall shape of the display device DD. In FIG. 1A, an embodiment where the display device DD and the display area DA have a rectangular shape elongated in the horizontal direction is illustrated.

The display device DD may include a display area DA and a non-display area NDA. The display area DA is an area where an image is displayed, and the non-display area NDA is an area where an image is not displayed. The display area DA may also be referred to as an active region, and the non-display area NDA may also be referred to as a non-active region. The display area DA may substantially occupy the center of the display device DD.

In an embodiment, as shown in FIGS. 1A and 1B, the display area DA may include a plurality of pixels PX. The shape of each pixel PX may be a rectangular or square shape in a plan view. However, the disclosure is not limited thereto, and it may be a rhombic shape in which each side is inclined with respect to one direction.

The non-display area NDA may be disposed around the display area DA. The non-display area NDA may completely or partially surround the display area DA. The display area DA may have a rectangular shape, and the non-display area NDA may be disposed adjacent to four sides of the display area DA. The non-display area NDA may form a bezel of the display device DD. Wires or circuit drivers included in the display device DD may be disposed in the non-display area NDA, or external devices may be mounted thereon.

Figure 2:
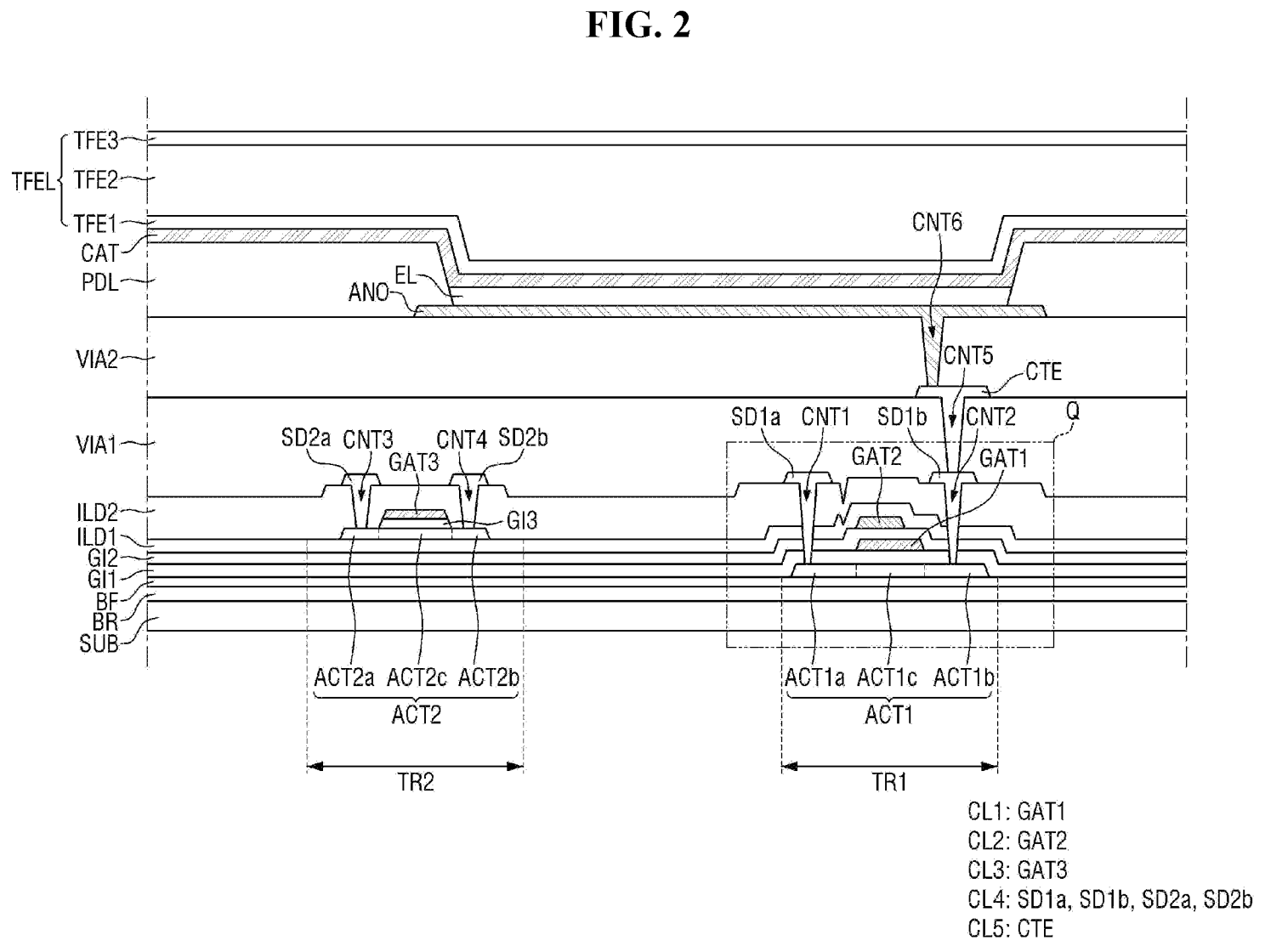
Figure 3:
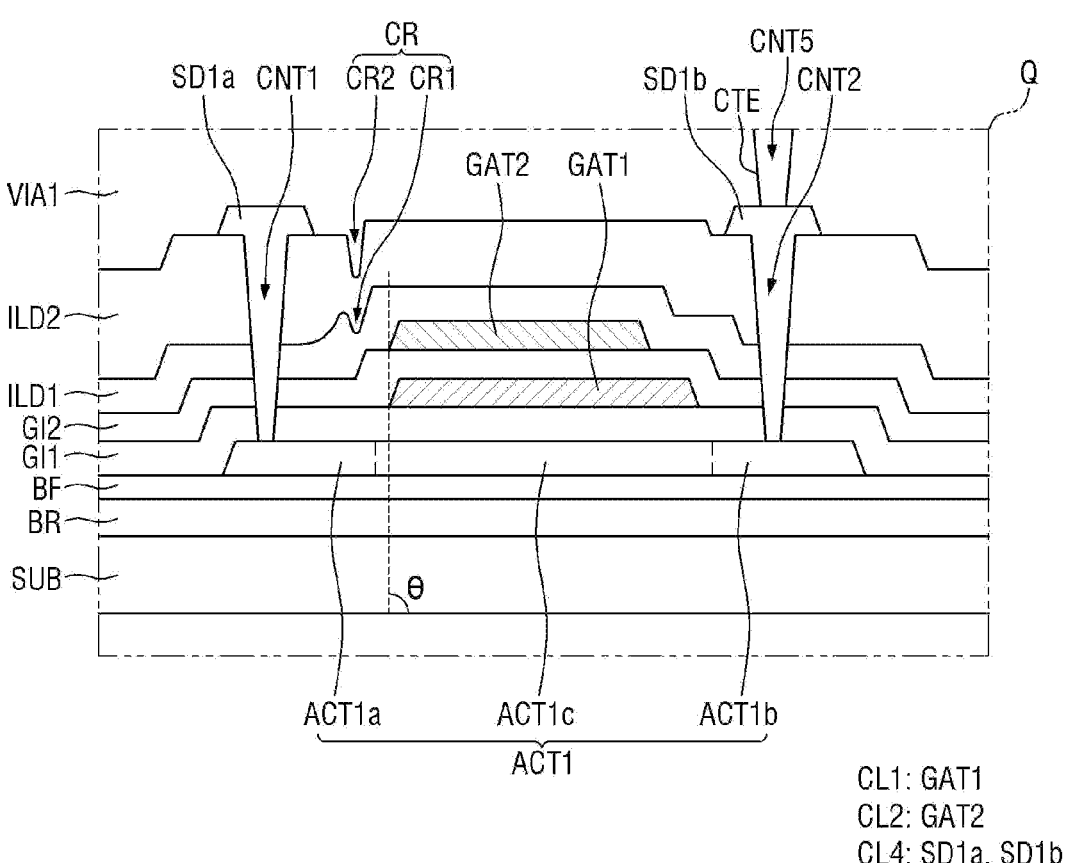
FIG. 3 is an enlarged view of area Q of FIG. 2.

FIG. 2 is a cross-sectional view of one pixel of a display device according to an embodiment. FIG. 3 is an enlarged view of area Q of FIG. 2.

Referring to FIGS. 2 and 3, in an embodiment, the display area DA may include a first transistor region TR1 in which a non-oxide inorganic semiconductor transistor (hereinafter, simply referred to as "silicon transistor") including polycrystalline silicon is disposed as a channel and a second transistor region TR2 in which an oxide semiconductor transistor (hereinafter, simply referred to as "oxide transistor") including an oxide semiconductor is disposed as a channel. The silicon transistor disposed in the first transistor region TR1 may be a P-channel metal-oxide-semiconductor ("PMOS") transistor. The oxide transistor disposed in the second transistor region TR2 may be an N-channel metal-oxide-semiconductor ("NMOS") transistor.

A base substrate SUB, a barrier layer BR, a buffer layer BF, a first semiconductor layer ACT1, a first gate insulating layer GI1, a first conductive layer CL1, a second gate insulating layer GI2, a second conductive layer CL2, a first interlayer insulating layer ILD1, a second semiconductor layer ACT2, a third gate insulating layer GI3, a third conductive layer CL3, a second interlayer insulating layer ILD2, a fourth conductive layer CL4, a first via layer VIA1, a fifth conductive layer CL5, a second via layer VIA2, a pixel electrode ANO and a pixel defining layer PDL may be sequentially disposed one on another in the display area DA. Each of the layers described above may have a single layer structure, or have a multilayer structure including a stack of multiple layers. Another layer may be further disposed between the respective layers.

The base substrate SUB supports the respective layers disposed thereon. The base substrate SUB may be made of, e.g., an insulating material such as a polymer resin, but is not limited thereto and the base substrate SUB may include a metal material.

The barrier layer BR may be disposed on the base substrate SUB. The barrier layer BR may prevent diffusion of impurity ions, prevent permeation of moisture or external air, and perform a surface planarization function. The barrier layer BR may include silicon nitride, silicon oxide, silicon oxynitride, or the like. Alternatively, the barrier layer BR may be omitted depending on the type of the base substrate SUB, process conditions, and the like.

The buffer layer BF may be disposed on the barrier layer BR. The buffer layer BF may include at least one of silicon nitride, silicon oxide, or silicon oxynitride. Alternatively, the buffer layer BF may be omitted depending on the type of the base substrate SUB, process conditions, and the like.

The first semiconductor layer ACT1 may be disposed on the buffer layer BF. The first semiconductor layer ACT1 may disposed in the first transistor region TR1.

The first semiconductor layer ACT1 may include or be made of polycrystalline silicon, monocrystalline silicon, amorphous silicon, or the like.

The first semiconductor layer ACT1 may include a channel region ACT1c disposed to overlap a first gate electrode GAT1 thereabove in a thickness direction and a first source/drain region ACT1a and a second source/drain region ACT1b of the first semiconductor layer ACT1 that are respectively located at one side and the other side of the channel region ACT1c. Herein, the thickness direction may be a thickness direction of the base substrate SUB. The first and second source/drain regions ACT1a and ACT1b of the first semiconductor layer ACT1 may include a plurality of carrier ions, thereby having higher conductivity and lower electric resistance than the channel region ACT1c.

The first gate insulating layer GI1 may be disposed on the first semiconductor layer ACT1. The first gate insulating layer GI1 may cover the side surface of the first semiconductor layer ACT1 as well as the top surface of the first semiconductor layer ACT1 except for a part where contact holes CNT1 and CNT2 are formed or defined therethrough. The first gate insulating layer GI1 may be disposed substantially over the entire surface of the base substrate SUB.

The first gate insulating layer GI1 may include a silicon compound, a metal oxide, or the like. In an embodiment, for example, the first gate insulating layer GI1 may include silicon oxide, silicon nitride, silicon oxynitride, aluminum oxide, tantalum oxide, hafnium oxide, zirconium oxide, titanium oxide, or the like. These may be used alone or in combination with each other. The first gate insulating layer GI1 may have a single layer structure or a multilayer structure including a multilayer stack of different materials.

The first conductive layer CL1 is disposed on the first gate insulating layer GI1. The first conductive layer CL1 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The first conductive layer CL1 may have a single layer structure or a multilayer structure.

The first conductive layer CL1 may be a gate conductive layer and may include the first gate electrode GAT1 disposed in the first transistor region TR1. The first gate electrode GAT1 may be a gate electrode of a silicon transistor. The first gate electrode GAT1 may be connected to a first electrode of a capacitor. The capacitor first electrode may be formed of or defined by the first gate electrode GAT1 itself, or may be formed of or defined by a portion extending from the first gate electrode GAT1. In an embodiment, for example, a part of the integrated pattern of the first conductive layer CL1 may overlap the first semiconductor layer ACT1 and function as the first gate electrode GAT1 at the corresponding region, and another part may not overlap the first semiconductor layer ACT1 and function as the capacitor first electrode overlapping a capacitor second electrode GAT2 thereon.

The second gate insulating layer GI2 may be disposed on the first conductive layer CL1. The second gate insulating layer GI2 may cover the side surface of the first gate electrode GAT1 as well as the top surface of the first gate electrode GAT1 except for the part where the contact holes CNT1 and CNT2 are formed or defined therethrough. The second gate insulating layer GI2 may be disposed substantially over the whole surface of the first gate insulating layer GI1.

The second gate insulating layer GI2 may include a silicon compound, a metal oxide, or the like. In an embodiment, for example, the second gate insulating layer GI2 may include silicon oxide, silicon nitride, silicon oxynitride, aluminum oxide, tantalum oxide, hafnium oxide, zirconium oxide, titanium oxide, or the like. These may be used alone or in combination with each other. The second gate insulating layer GI2 may have a single layer structure or a multilayer structure including a multilayer stack of different materials.

The second conductive layer CL2 is disposed on the second gate insulating layer GI2. The second conductive layer CL2 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The second conductive layer CL2 may have a single layer structure or a multilayer structure.

The second conductive layer CL2 may be a capacitor conductive layer and include the capacitor second electrode GAT2 disposed in the first transistor region TR1. The capacitor second electrode GAT2 may form the capacitor while facing the capacitor first electrode connected to the first gate electrode GAT1 thereunder with the second gate insulating layer GI2 interposed therebetween.

The first interlayer insulating layer ILD1 is disposed on the second conductive layer CL2. The first interlayer insulating layer ILD1 may include a silicon compound, a metal oxide, or the like. In an embodiment, for example, the first interlayer insulating layer ILD1 may include silicon oxide, silicon nitride, silicon oxynitride, aluminum oxide, tantalum oxide, hafnium oxide, zirconium oxide, titanium oxide, or the like. These may be used alone or in combination with each other. The first interlayer insulating layer ILD1 may have a single layer structure or a multilayer structure including a multilayer stack of different materials.

The second semiconductor layer ACT2 is disposed on the first interlayer insulating layer ILD1. The second semiconductor layer ACT2 may be disposed in the second transistor region TR2. The second semiconductor layer ACT2 may include an oxide semiconductor. The oxide may include at least one selected from gallium-indium-zinc oxide (G-I-Z-O), zinc (Zn), indium (In), gallium (Ga), tin (Sn), cadmium (Cd), germanium (Ge), or hafnium (Hf), or any combination thereof. The oxide may include at least one selected from indium-gallium-zinc oxide ("IGZO"), zinc-tin oxide ("ZTO"), or indium-tin oxide ("ITO").

The second semiconductor layer ACT2 may include a channel region ACT2c disposed to overlap a third gate electrode GAT3 thereabove in the thickness direction, and a first source/drain region ACT2a and a second source/drain region ACT2b of the second semiconductor layer ACT2 that are respectively located at one side and the other side of the channel region ACT2c. The first and second source/drain regions ACT2a and ACT2b of the second semiconductor layer ACT2 are conductorized regions, and may have higher conductivity and lower electrical resistance than the channel region ACT2c.

The third gate insulating layer GI3 is disposed on the second semiconductor layer ACT2. The third gate insulating layer GI3 may be disposed only in a partial region unlike the first and second gate insulating layers GI1 and GI2. That is, the third gate insulating layer GI3 may cover the channel region ACT2c of the second semiconductor layer ACT2 and expose the first and second source/drain regions ACT2a and ACT2b and the side surface of the second semiconductor layer ACT2. The third gate insulating layer GI3 may have substantially a same pattern shape as the third gate electrode GAT3 thereabove.

The third gate insulating layer GI3 may include a silicon compound, a metal oxide, or the like. In an embodiment, for example, the third gate insulating layer GI3 may include silicon oxide, silicon nitride, silicon oxynitride, aluminum oxide, tantalum oxide, hafnium oxide, zirconium oxide, titanium oxide, or the like. These may be used alone or in combination with each other. The third gate insulating layer GI3 may have a single layer structure or a multilayer structure including a multilayer stack of different materials.

The third conductive layer CL3 is disposed on the third gate insulating layer GI3. The third conductive layer CL3 may be a gate conductive layer and may include the third gate electrode GAT3 of the transistor disposed in the second transistor region TR2. The third conductive layer CL3 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The third conductive layer CL3 may have a single layer structure or a multilayer structure.

The second interlayer insulating layer ILD2 is disposed on the third conductive layer CL3. The second interlayer insulating layer ILD2 may include a silicon compound, a metal oxide, or the like. In an embodiment, for example, the second interlayer insulating layer ILD2 may include silicon oxide, silicon nitride, silicon oxynitride, aluminum oxide, tantalum oxide, hafnium oxide, zirconium oxide, titanium oxide, or the like. These may be used alone or in combination with each other. The second interlayer insulating layer ILD2 may have a single layer structure or a multilayer structure including a multilayer stack of different materials.

The fourth conductive layer CL4 is disposed on the second interlayer insulating layer ILD2. The fourth conductive layer CL4 may include at least one metal selected from aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The fourth conductive layer CL4 may have a single layer structure or a multilayer structure.

The fourth conductive layer CL4 may be a data conductive layer and may include a first source/drain electrode SD1a and a second source/drain electrode SD1b of the transistor disposed in the first transistor region TR1 and a first source/drain electrode SD2a and a second source/drain electrode SD2b of the transistor disposed in the second transistor region TR2.

In the transistor disposed in the first transistor region TR1, the first source/drain electrode SD1a may penetrate or be disposed through the second interlayer insulating layer ILD2, the second gate insulating layer GI2 and the first gate insulating layer GI1 to be connected to the first source/drain region ACT1a of the first semiconductor layer ACT1 via the first contact hole CNT1 exposing the first source/drain region ACT1a of the first semiconductor layer ACT1. The second source/drain electrode SD1b may penetrate or be disposed through the second interlayer insulating layer ILD2, the second gate insulating layer GI2 and the first gate insulating layer GI1 to be connected to the second source/drain region ACT1b of the first semiconductor layer ACT1 via the second contact hole CNT2 exposing the second source/drain region ACT1b of the first semiconductor layer ACT1.

In the transistor disposed in the second transistor region TR2, the first source/drain electrode SD2a may penetrate or be disposed through the second interlayer insulating layer ILD2 to be connected to the first source/drain region ACT2a of the second semiconductor layer ACT2 via a third contact hole CNT3 exposing the first source/drain region ACT2a of the second semiconductor layer ACT2. The second source/drain electrode SD2b may penetrate or be disposed through the second interlayer insulating layer ILD2 to be connected to a second source/drain region ACT2b of the second semiconductor layer ACT2 via a fourth contact hole CNT4 exposing the second source/drain region ACT2b of the second semiconductor layer ACT2.

The first via layer VIA1 is disposed on the fourth conductive layer CL4. The first via layer VIA1 may include an inorganic insulating material or an organic insulating material. The first via layer VIA1 may have a single layer structure or a multilayer structure including a multilayer stack of different materials.

The first via layer VIA1 may be disposed on top of or above the second interlayer layer ILD2 to completely cover the top surface of the second interlayer insulating layer ILD2. In an embodiment where the first via layer VIA1 is formed of an organic film, the top surface thereof may be flat despite a lower stepped portion.

The fifth conductive layer CL5 is disposed on the first via layer VIA1. The fifth conductive layer CL5 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The fifth conductive layer CL5 may have a single layer structure or a multilayer structure.

The fifth conductive layer CL5 may include a connection electrode CTE. A fifth contact hole CNT5 exposing the second source/drain electrode SD1b of the transistor disposed in the first transistor region TR1 may be disposed on the first via layer VIA1 and the connection electrode CTE may be connected to the second source/drain electrode SD1b via the fifth contact hole CNT5.

The second via layer VIA2 is disposed on the connection electrode CTE. The second via layer VIA2 may include an inorganic insulating material or an organic insulating material. The second via layer VIA2 may have a single layer structure or a multilayer structure including a multilayer stack of different materials.

The pixel electrode ANO is disposed on the second via layer VIA2. The pixel electrode ANO may be an anode electrode. The pixel electrode ANO may be disposed separately for each pixel. The pixel electrode ANO may penetrate or be disposed through the second via layer VIA2 and may be electrically connected to the connection electrode CTE via a sixth contact hole CNT6 exposing a part of the connection electrode CTE.

The pixel electrode ANO may have a stacked structure formed by stacking a material layer having a high work function, such as indium tin oxide ("ITO"), indium zinc oxide ("IZO"), zinc oxide (ZnO) and indium oxide (In2O3), and a reflective material layer such as silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca), or a mixture thereof, but is not limited thereto. The layer having a high work function may be disposed above the reflective material layer and disposed closer to a light emitting layer EL. The pixel electrode ANO may have a multilayer structure such as ITO/Mg, ITO/MgF, ITO/Ag and ITO/Ag/ITO, but is not limited thereto.

The pixel defining layer PDL may be disposed on the pixel electrode ANO. In an embodiment, an opening partially exposing the pixel electrode ANO may be defined through the pixel defining layer PDL. The pixel defining layer PDL may include or be formed of an organic insulating material or an inorganic insulating material. In an embodiment, for example, the pixel defining layer PDL may include at least one selected from polyimide resin, acrylic resin, a silicon compound, or polyacrylic resin.

The light emitting layer EL is disposed on the pixel electrode ANO exposed by the pixel defining layer PDL. The light emitting layer EL may include an organic material layer. The light emitting layer EL may further include a hole injection/transport layer and/or an electron injection/transport layer.

A cathode electrode CAT may be disposed on the light emitting layer EL. The cathode electrode CAT may be a common electrode extended across all the pixels PX. The pixel electrode ANO, the light emitting layer EL, and the cathode electrode CAT may each constitute an organic light emitting element.

A thin film encapsulation layer TFEL including a first inorganic film TFE1, a first organic film TFE2 and a second inorganic film TFE3 are disposed on top of or above the cathode electrode CAT. The first inorganic film TFE1 and the second inorganic film TFE3 may be in contact with each other at the end of the thin film encapsulation layer TFEL. The first organic film TFE2 may be sealed by the first inorganic film TFE1 and the second inorganic film TFE3.

Each of the first inorganic film TFE1 and the second inorganic film TFE3 may include silicon nitride, silicon oxide, silicon oxynitride, or the like. The first organic film TFE2 may include an organic insulating material.

Hereinafter, a crack CR that may occur in the insulating film covering the two conductive layers when edges of the two conductive layers are aligned will be described with reference to FIG. 3.

In an embodiment, the first gate electrode GAT1 and a second gate electrode GAT2 may overlap each other. In such an embodiment, at least a part of edges of the first gate electrode GAT1 and the second gate electrode GAT2 may be aligned with each other in the thickness direction. In an embodiment, for example, one edge of the first gate electrode GAT1 and one edge of the second gate electrode GAT2 may be aligned with each other in the thickness direction. An angle between one surface of the base substrate SUB and an imaginary line connecting one edge of the first gate electrode GAT1 and one edge of the second gate electrode GAT2 may be defined as an alignment angle θ. At least some of edges of the first gate electrode GAT1 and the second gate electrode GAT2 aligned with each other in the thickness direction may mean that the alignment angle θ is in a range of about 70° to 110° or a range of about 80° to 100°. In an embodiment, for example, the alignment angle θ between some of edges of the first gate electrode GAT1 and the second gate electrode GAT2 may be about 90°, but is not limited thereto.

When at least some of edges of the first gate electrode GAT1 and the second gate electrode GAT2 are aligned with each other in the thickness direction, the first interlayer insulating layer ILD1 and the second interlayer insulating layer ILD2 disposed on the second electrode GAT2 may include the crack CR recessed toward the base substrate SUB. The crack CR may be formed to be adjacent to a region where at least some of edges of the first gate electrode GAT1 and the second gate electrode GAT2 overlap each other in the thickness direction. The crack CR may be disposed to be adjacent to the region where at least some of the edges of the first gate electrode GAT1 and the second gate electrode GAT2 overlap each other in the thickness direction, while surrounding the corresponding region. The crack CR may be disposed between the first gate electrode GAT1 and the first contact hole CNT1. In addition, the crack CR may be disposed between the second gate electrode GAT2 and the first contact hole CNT1.

In an embodiment, the crack CR may include a first crack CR1 included in the first interlayer insulating layer ILD1 and a second crack CR2 included in the second interlayer insulating layer ILD2. The first crack CR1 and the second crack CR2 may be disposed to partially overlap each other. The crack CR may be formed due to an abrupt step formed in a region where the edges of the first gate electrode GAT1 and the second gate electrode GAT2 are aligned to overlap each other.

Various foreign substances may enter the crack CR having a recessed shape during a photolithography process. When a foreign substance enters the crack CR, an outgassing phenomenon occurs in which the foreign substance is separated in the vacuum treatment process performed after the photoresist application process, thereby removing the photoresist from the area, which may cause defects in the photolithography process.

Hereinafter, a photolithography apparatus according to an embodiment in which defects in such a photolithography process described above are prevented will be described.

Figure 4:
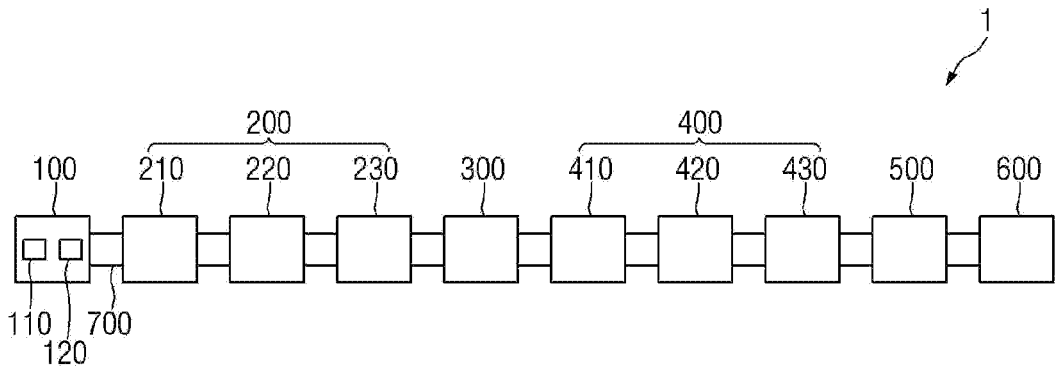
FIG. 4 is a schematic view of a photolithography apparatus according to an embodiment.
Figure 5:
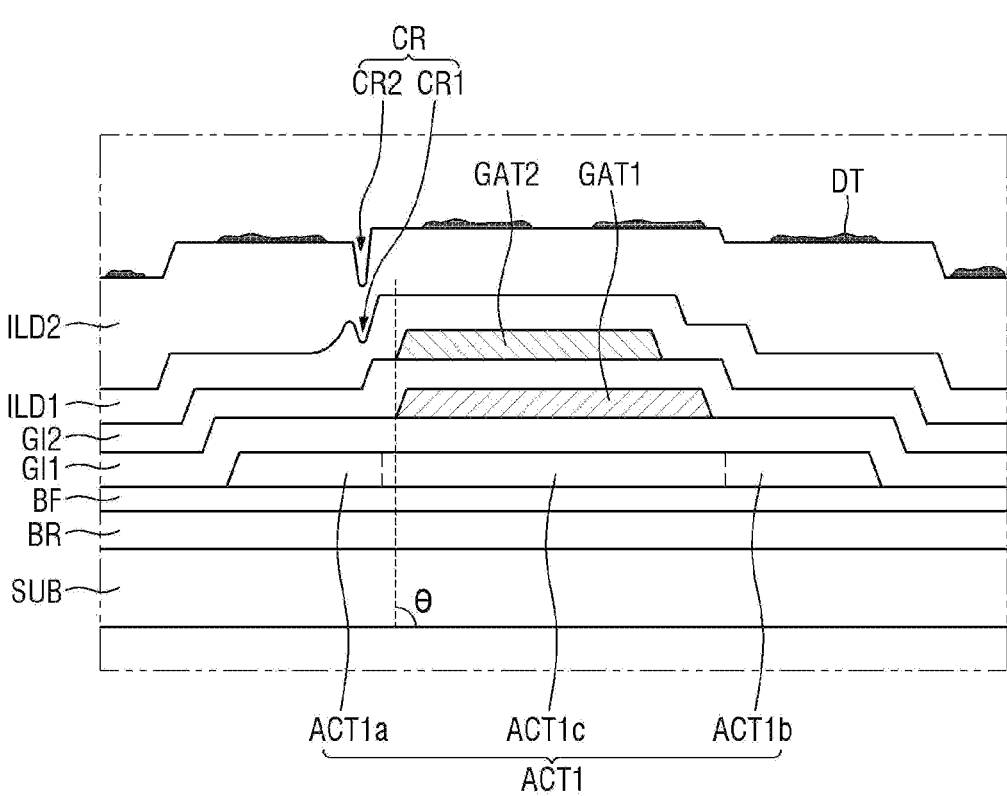
FIG. 5 is a partial cross-sectional view of a target substrate before cleaning.
Figure 6:
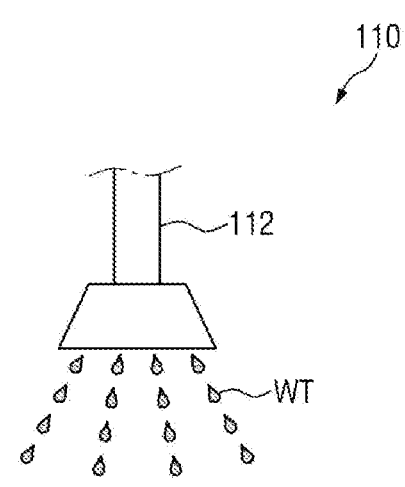
FIGS. 6 and 7 are schematic views of a cleaning unit according to an embodiment.
Figure 6:
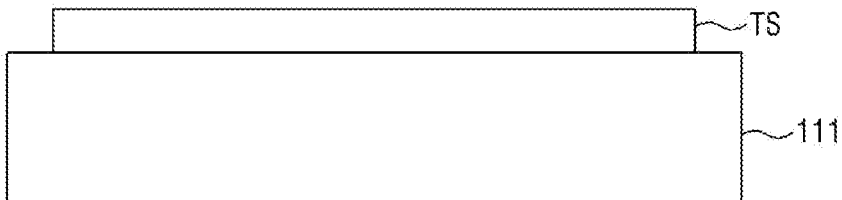
Figure 7:
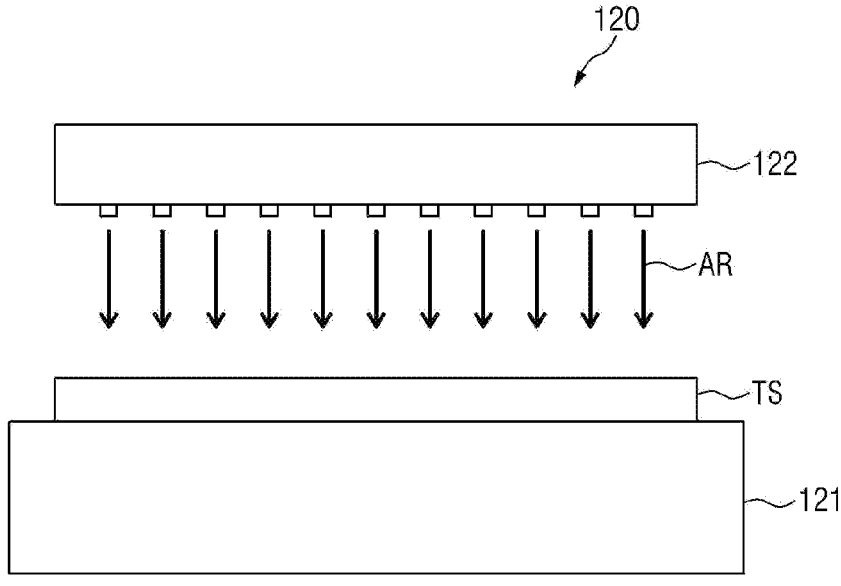
Figure 8:
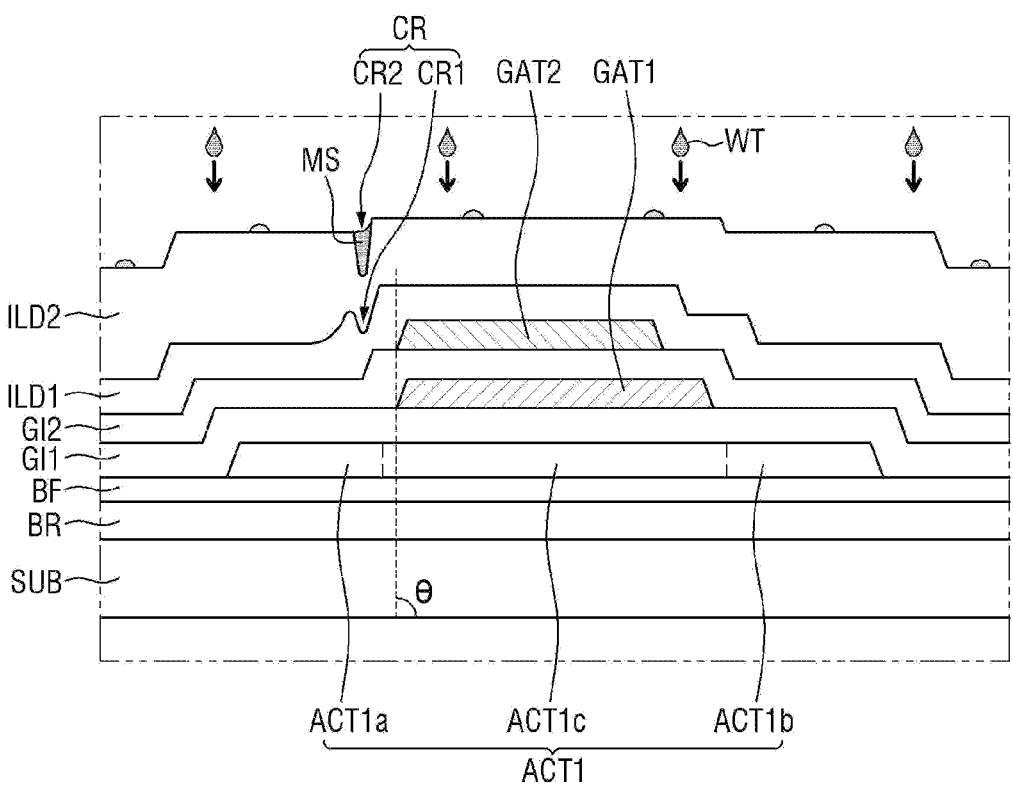
FIG. 8 is a partial cross-sectional view of a target substrate that is cleaned by a cleaning unit according to an embodiment.

FIG. 4 is a schematic view of a photolithography apparatus according to an embodiment. FIG. 5 is a partial cross-sectional view of a target substrate before cleaning. FIGS. 6 and 7 are schematic views of a cleaning unit according to an embodiment. FIG. 8 is a partial cross-sectional view of a target substrate that is cleaned by a cleaning unit according to an embodiment.

Referring to FIG. 4, an embodiment of a photolithography apparatus 1 may include a cleaning unit 100, a drying unit 200, a coating unit 300, a curing unit 400, an exposure unit 500 and a developing unit 600. When a photolithography process is performed by using the photolithography apparatus 1 according to an embodiment, a target substrate TS may be processed by the cleaning unit 100, the drying unit 200, the coating unit 300, the curing unit 400, the exposure unit 500 and the developing unit 600 in a sequential order.

An embodiment of the photolithography apparatus 1 may further include a transfer unit 700 for connecting the cleaning unit 100, the drying unit 200, the coating unit 300, the curing unit 400, the exposure unit 500, and the developing unit 600 with each other. The transfer unit 700 may move the target substrate TS, on which the photolithography process is performed, to each of the cleaning unit 100, the drying unit 200, the coating unit 300, the curing unit 400, the exposure unit 500, and the developing unit 600. In an embodiment, for example, the transfer unit 700 may be a conveyor belt.

The cleaning unit 100 may clean the target substrate TS before coating the photoresist. The cleaning unit 100 may include a cleaning solution sprayer 110 and an air sprayer 120. The target substrate TS may undergo a treatment process through the air sprayer 120 after a treatment process through the cleaning solution sprayer 110.

The drying unit 200 may process the target substrate TS provided from the cleaning unit 100. In such an embodiment, the drying unit 200 may remove the liquid remaining on the target substrate TS on which the cleaning process has been performed by the cleaning unit 100. The drying unit 200 may include a first heating unit 210, a first cooling unit 220, and a first vacuum unit 230. In an embodiment, the drying unit 200 included in the photolithography apparatus 1 may be configured in a way such that the target substrate TS is processed by the first heating unit 210, the first cooling unit 220, and the first vacuum unit 230 in a sequential order. In such an embodiment of the photolithography apparatus 1, the first vacuum unit 230 may be disposed between the first cooling unit 220 and the coating unit 300 to be described later.

The coating unit 300 may process the target substrate TS provided from the drying unit 200. In an embodiment, the coating unit 300 may form a photoresist layer PR1 by applying the photoresist on the target substrate TS, on which the cleaning process has been performed by the cleaning unit 100 and the drying process has been performed by the drying unit 200.

The curing unit 400 may process the target substrate TS provided from the coating unit 300. The curing unit 400 may cure the photoresist layer PR1 applied by the coating unit 300. The curing unit 400 may include a second vacuum unit 410, a second heating unit 420 and a second cooling unit 430. In the curing unit 400, the target substrate TS may be processed sequentially by the second vacuum unit 410, the second heating unit 420, and the second cooling unit 430. The disclosure is not limited thereto and the processing order of the second vacuum unit 410, the second heating unit 420, and the second cooling unit 430 may be variously changed. The second vacuum unit 410 may be substantially the same component as the first vacuum unit 230, the second heating unit 420 may be substantially the same component as the first heating unit 210, and the second cooling unit 430 may be substantially the same component as the first cooling unit 220. The first vacuum unit 230, the first heating unit 210 and the first cooling unit 220 will be described in detail later.

The exposure unit 500 may process the target substrate TS provided from the curing unit 400. After disposing a mask MK on the target substrate TS including the cured photoresist layer PR1, the exposure unit 500 may radiate light L to partially radiate the light L onto the photoresist layer PR1.

The developing unit 600 may process the target substrate TS provided from the exposure unit 500. The developing unit 600 may develop the photoresist layer PR1 partially irradiated with the light L in the exposure unit 500 to change the photoresist layer PR1 into a photoresist pattern PR2.

A cleaning process of the target substrate TS will be described with reference to FIGS. 5 to 8. In an embodiment, the photolithography process may be a process of forming the first contact hole CNT1 and the second contact hole CNT2 described with reference to FIGS. 2 and 3.

In an embodiment, as shown in FIG. 5, the target substrate TS in a state before the cleaning process may include the base substrate SUB, the barrier layer BR, the buffer layer BF, the first semiconductor layer ACT1, the first gate insulating layer GI1, the first gate electrode GAT1, the second gate insulating layer GI2, the second gate electrode GAT2, the first interlayer insulating layer ILD1 and the second interlayer insulating layer ILD2.

At least one edge of the first gate electrode GAT1 and the second gate electrode GAT2 may be aligned with each other. Outside the region where the edges of the first gate electrode GAT1 and the second gate electrode GAT2 are aligned, the first crack CR1 included in the first interlayer insulating layer ILD1 and the second crack CR2 included in the second interlayer insulating layer ILD2 may be disposed. The first crack CR1 may have a shape in which the top surface of the first interlayer insulating layer ILD1 is recessed toward the base substrate SUB, and the second crack CR2 may have a shape in which the top surface of the second interlayer insulating layer ILD2 is recessed toward the base substrate SUB. In addition, the first contact hole CNT1 and the second contact hole CNT2 are not formed through the first gate insulating layer GI1, the second gate insulating layer GI2, the first interlayer insulating layer ILD1 and the second interlayer insulating layer ILD2.

A contaminant DT may be disposed on the second interlayer insulating layer ILD2 of the target substrate TS in a state before the cleaning process.

In an embodiment, as shown in FIGS. 6 and 7, the cleaning unit 100 included in the photolithography apparatus 1 may include the cleaning solution sprayer 110 and the air sprayer 120. The target substrate TS on which the cleaning process is performed by the cleaning unit 100 may pass through the cleaning solution sprayer 110 and then through the air sprayer 120. In such an embodiment, the air sprayer 120 may spray air AR onto the target substrate TS provided from the cleaning solution sprayer 110.

The cleaning solution sprayer 110 may spray a cleaning solution WT onto the target substrate TS to remove the contaminant DT on the target substrate TS. In an embodiment, the cleaning solution sprayer 110 may include a first stage unit 111 and a cleaning solution spraying unit 112 disposed above the first stage unit 111. The first stage unit 111 may support the target substrate TS, and the cleaning solution spraying unit 112 may discharge and spray the cleaning solution WT onto the target substrate TS. The cleaning solution WT may include water, but is not limited thereto and may include other materials having cleaning power.

The air sprayer 120 may spray the air AR onto the target substrate TS after the cleaning solution WT is sprayed thereon. The air AR sprayed onto the target substrate TS may remove the remaining contaminant DT on the target substrate TS or remove the cleaning solution WT remaining on the target substrate TS. In an embodiment, the air sprayer 120 may include a second stage unit 121 and an air spraying unit 122 disposed on the second stage unit 121. The second stage unit 121 may support the target substrate TS and the air spraying unit 122 may discharge and spray the air AR to the target substrate TS. In an embodiment, for example, the air spraying unit 122 may be an air knife, but is not limited thereto.

With reference to FIG. 8 showing the target substrate TS after the spraying process of the cleaning solution WT using the cleaning unit 100, moisture MS may be disposed on the second interlayer insulating layer ILD2. Here, the moisture MS may include a component of the cleaning solution WT.

In addition, the moisture MS may enter the crack CR. Specifically, the moisture MS may enter the second crack CR2 exposed to the outside. In an embodiment, a process of removing the moisture MS may be performed before the photoresist application process to prevent a part of the photoresist layer PR1 from being removed due to the outgassing phenomenon in the vacuum treatment process performed after the photoresist application process.

Figure 9:
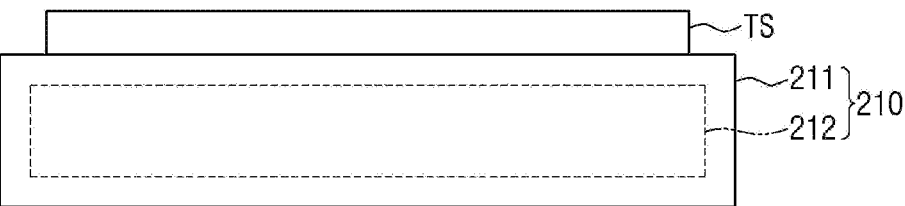
FIG. 9 is a schematic view of a first heating unit according to an embodiment.
Figure 10:
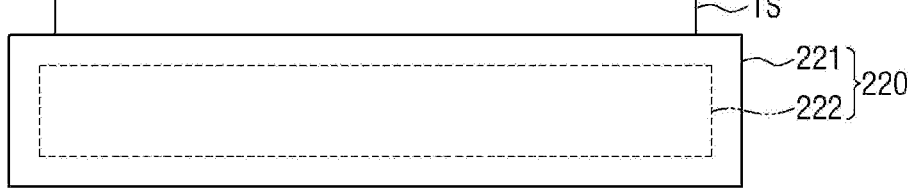
FIG. 10 is a schematic view of a first cooling unit according to an embodiment.
Figure 11:
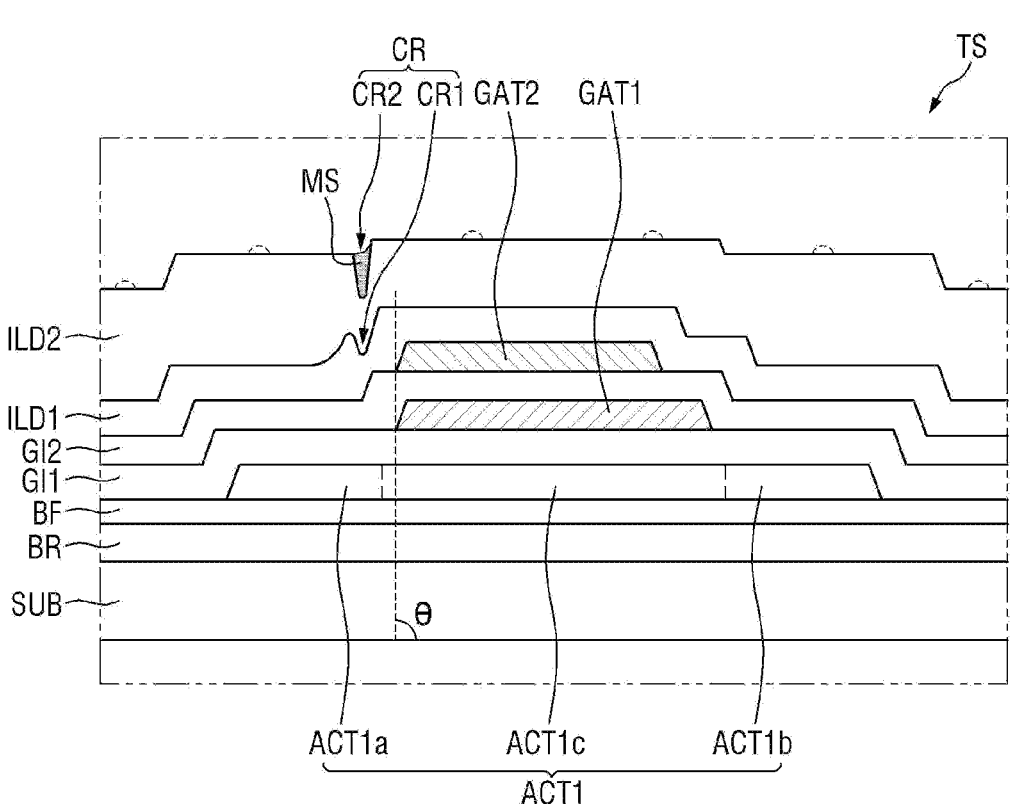
FIG. 11 is a partial cross-sectional view of a target substrate which has passed through the first heating unit and the first cooling unit.
Figure 12:
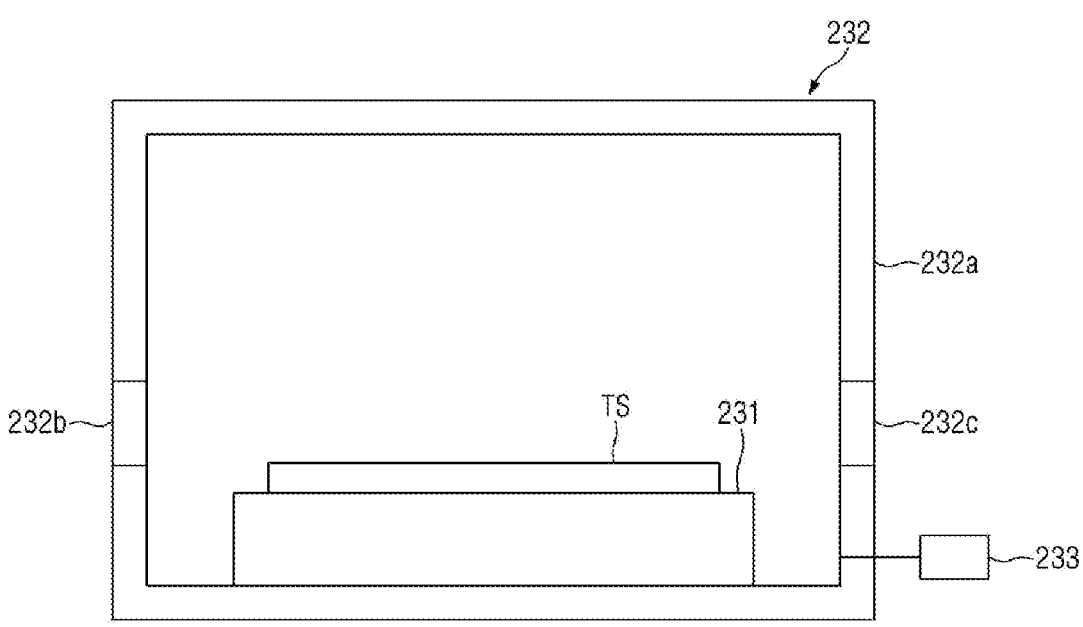
FIG. 12 is a schematic view of a vacuum unit according to one embodiment.
Figure 13:
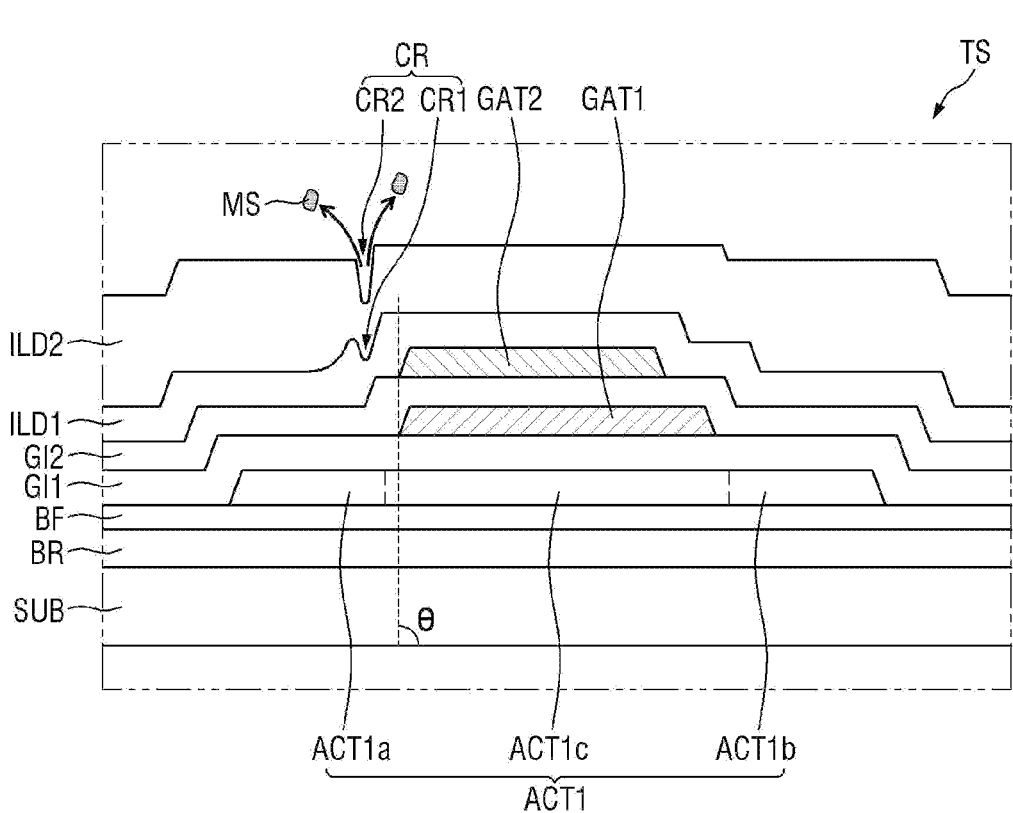
FIG. 13 is a partial cross-sectional view of a target substrate which has passed through the vacuum unit.
Figure 14:
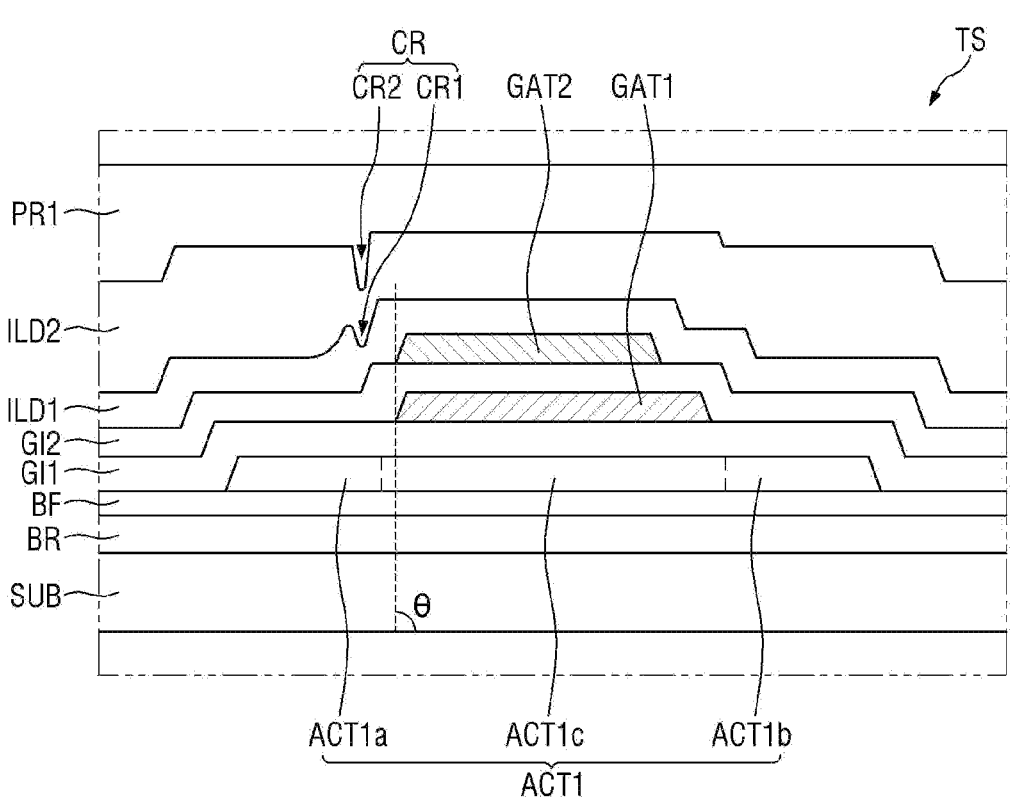
FIGS. 14 to 17 are schematic views of a photolithography process.

FIG. 9 is a schematic view of a first heating unit according to an embodiment. FIG. 10 is a schematic view of a first cooling unit according to an embodiment. FIG. 11 is a partial cross-sectional view of a target substrate which has passed through the first heating unit and the first cooling unit. FIG. 12 is a schematic view of a vacuum unit according to an embodiment. FIG. 13 is a partial cross-sectional view of a target substrate which has passed through the vacuum unit.

Referring to FIGS. 9 to 13, an embodiment of the drying unit 200 may include the first heating unit 210, the first cooling unit 220 and the first vacuum unit 230. The drying unit 200 may dry the target substrate TS by removing the moisture MS disposed on the target substrate TS.

In an embodiment, the first heating unit 210 may include a first heating stage unit 211 on which the target substrate TS is mounted and a first heater 212 that provides heat to the target substrate TS mounted on the first heating stage unit 211. The first heater 212 may be coupled to the first heating stage unit 211. In an embodiment, for example, the first heater 212 may be disposed inside the first heating stage unit 211, but is not limited thereto. The first heater 212 may provide heat to the target substrate TS to promote evaporation of the moisture MS disposed on the target substrate TS.

In an embodiment, the first cooling unit 220 may include a first cooling stage unit 221 on which the target substrate TS is mounted and a first cooler 222 that cools the target substrate TS mounted on the first cooling stage unit 221. The first cooler 222 may be coupled to the first cooling stage unit 221. In an embodiment, for example, the first cooler 222 may be disposed in the first cooling stage unit 221, but is not limited thereto. The first cooler 222 may lower the temperature of the target substrate TS in which the temperature thereof is increased due to the first heating unit 210. In an embodiment, the first cooling unit 220 may lower the temperature of the target substrate TS at a room temperature without operating the first cooler 222. In an alternative embodiment, the first cooling unit 220 may include only the first cooling stage unit 221 without the first cooler 222 to lower the temperature of the target substrate TS at a room temperature.

Most of the moisture MS disposed on the second interlayer insulating layer ILD2 may be removed from the target substrate TS that has passed through the first heating unit 210 and the first cooling unit 220. However, the moisture MS disposed in the second crack CR2 may still be retained without being removed even after passing through the first heating unit 210 and the first cooling unit 220. In an embodiment, the first vacuum unit 230 may be employed to remove the moisture MS retained in the second crack CR2 even after passing through the first heating unit 210 and the first cooling unit 220.

In an embodiment, as shown in FIG. 12, the first vacuum unit 230 may include a first vacuum chamber 232 including a closed inner space, a first vacuum stage unit 231 disposed in the inner space of the first vacuum chamber 232 and on which the target substrate TS is mounted, and a first vacuum pump 233 that makes the inner space of the first vacuum chamber 232 into a vacuum state or maintains the inner space of the first vacuum chamber 232 in a vacuum state.

The first vacuum chamber 232 may include a first housing 232*a*, and a first gate 232*b* and a second gate 232*c* through which the target substrate TS is loaded into or unloaded from the first housing 232*a*. The first housing 232*a* may define a closed inner space of the first vacuum chamber 232. The first gate 232*b* and the second gate 232*c* may connect the inner space of the first housing 232*a* to the outside. One of the first gate 232*b* and the second gate 232*c* is an inlet through which the target substrate TS is loaded into the first housing 232*a*, and the other of the first gate 232*b* and the second gate 232*c* is an outlet through which the target substrate TS is unloaded from the first housing 232*a* when the vacuuming treatment process is completed by the first vacuum unit 230. However, without being limited thereto, one of the first gate 232*b* and the second gate 232*c* may be omitted, and the first vacuum chamber 232 may include only one passage.

When the vacuum treatment process is performed on the target substrate TS by the first vacuum unit 230, the target substrate TS may be mounted on the first vacuum stage unit 231.

The first vacuum pump 233 may provide a negative pressure to the first vacuum chamber 232 to make the inner space of the first vacuum chamber 232 into a vacuum state, or maintain the inner space of the first vacuum chamber 232 in a vacuum state. The vacuum state referred to herein does not mean a complete vacuum but may mean a low pressure sufficient to remove foreign substances retained in the crack CR included in the target substrate TS.

The moisture MS disposed in the second crack CR2 of the target substrate TS may be removed in a vacuum treatment process performed by the first vacuum unit 230 as illustrated in FIG. 13. Residual moisture MS may not exist on the second interlayer insulating layer ILD2 of the target substrate TS on which the vacuum treatment process has been completed by the first vacuum unit 230. In such an embodiment, the moisture MS does not exist on the target substrate TS that has passed through the drying unit 200 including the first heating unit 210, the first cooling unit 220 and the first vacuum unit 230. Afterwards, a photoresist may be applied through the coating unit 300 to form a photoresist layer PR1.

Hereinafter, the remaining processes of the photolithography process using the coating unit 300, the curing unit 400, the exposure unit 500, and the developing unit 600 after the cleaning and drying processes of the target substrate TS will be described.

FIGS. 14 to 17 are schematic views of a photolithography process.

Referring to FIGS. 14 to 17, in an embodiment of the photolithography process, the photoresist layer PR1 may be applied on the second interlayer insulating layer ILD2 of the target substrate TS on which the cleaning and drying processes have been completed by the cleaning unit 100 and the drying unit 200. The process of applying the photoresist layer PR1 may be performed by the coating unit 300. The photoresist layer PR1 may be entirely disposed on the second interlayer insulating layer ILD2. The photoresist layer PR1 may fill the inside of the second crack CR2 included in the second interlayer insulating layer ILD2. The photoresist layer PR1 may include an organic material, and may have a flat top surface although the bottom surface thereof includes irregularities.

When the photoresist layer PR1 is applied, the curing process may be performed on the photoresist layer PR1 by the curing unit 400. The curing unit 400 may include a second vacuum unit 410, a second heating unit 420 and a second cooling unit 430. The second vacuum unit 410 may be substantially the same as the first vacuum unit 230, the second heating unit 420 may be substantially the same as the first heating unit 210, and the second cooling unit 430 may be substantially the same as the first cooling unit 220.

The curing process of the photoresist layer PR1 may be performed sequentially in the order of a vacuum treatment process using the second vacuum unit 410, a heating process using the second heating unit 420, and a cooling process using the second cooling unit 430. However, the disclosure is not limited thereto, and the order of the vacuum treatment process, the heating process and the cooling process may be variously changed.

During the curing process of the photoresist layer PR1, when foreign substances such as moisture MS exist between the photoresist layer PR1 and the second interlayer insulating layer ILD2, an outgassing phenomenon in which the foreign substances penetrate the photoresist layer PR1 and are discharged to the outside may occur during the vacuum treatment process. In this case, the photoresist layer PR1 may be removed from the region from which the foreign substances are discharged so that a region not to be etched may be etched in a subsequent etching process. In an embodiment of the invention, the photolithography apparatus 1 may use the first vacuum unit 230 to remove the foreign substances such as the moisture MS disposed in the second crack CR2 before using the coating unit 300 to apply the photoresist layer PR1, thereby improving the completeness of the photolithography process.

Figure 15:
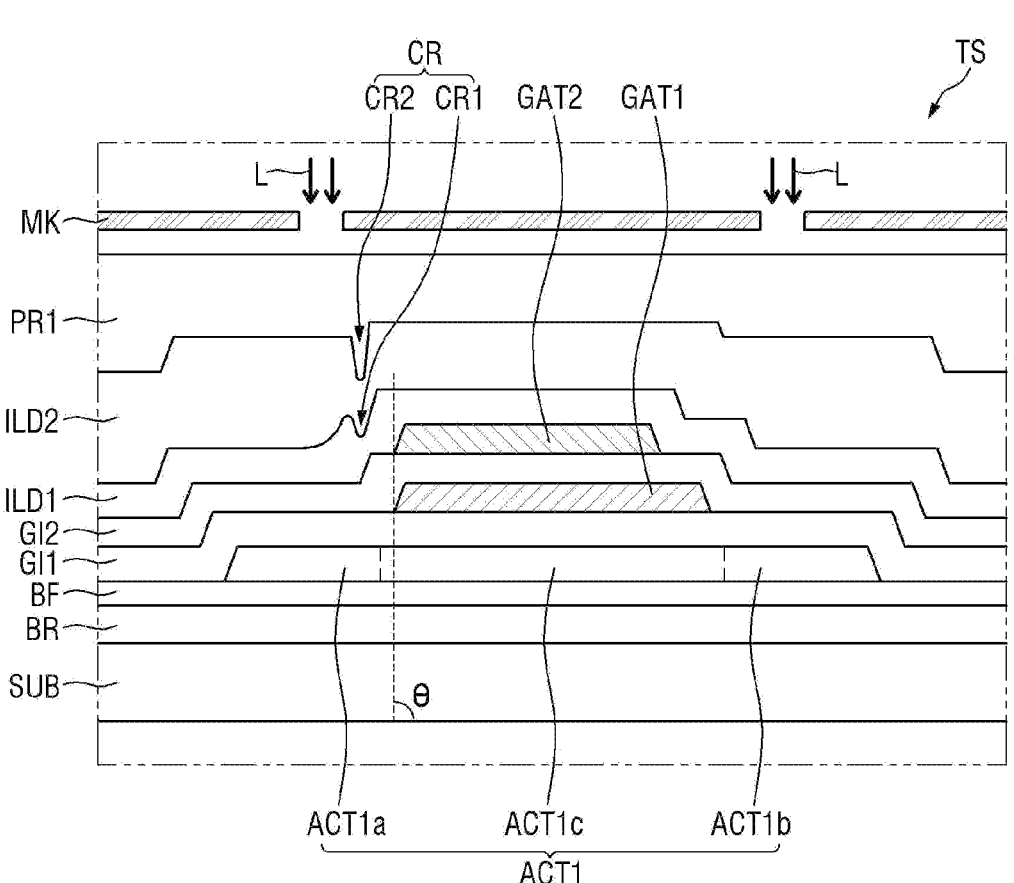

In an embodiment, as shown in FIG. 15, when the photoresist layer PR1 is cured, a light exposure process in which the light L is radiated may be performed after disposing the mask MK on the photoresist layer PR1. The light exposure process may be performed by the exposure unit 500. In an embodiment, the exposure unit 500 may include the mask MK and a light radiation unit (not shown).

After the light exposure process of the target substrate TS, a development process may be performed on the target substrate TS. In an embodiment, for example, the development process of the target substrate TS may be performed by using a developing solution. The photoresist layer PR1 may change into the photoresist pattern PR2 through the development process of the target substrate TS.

Figure 16:
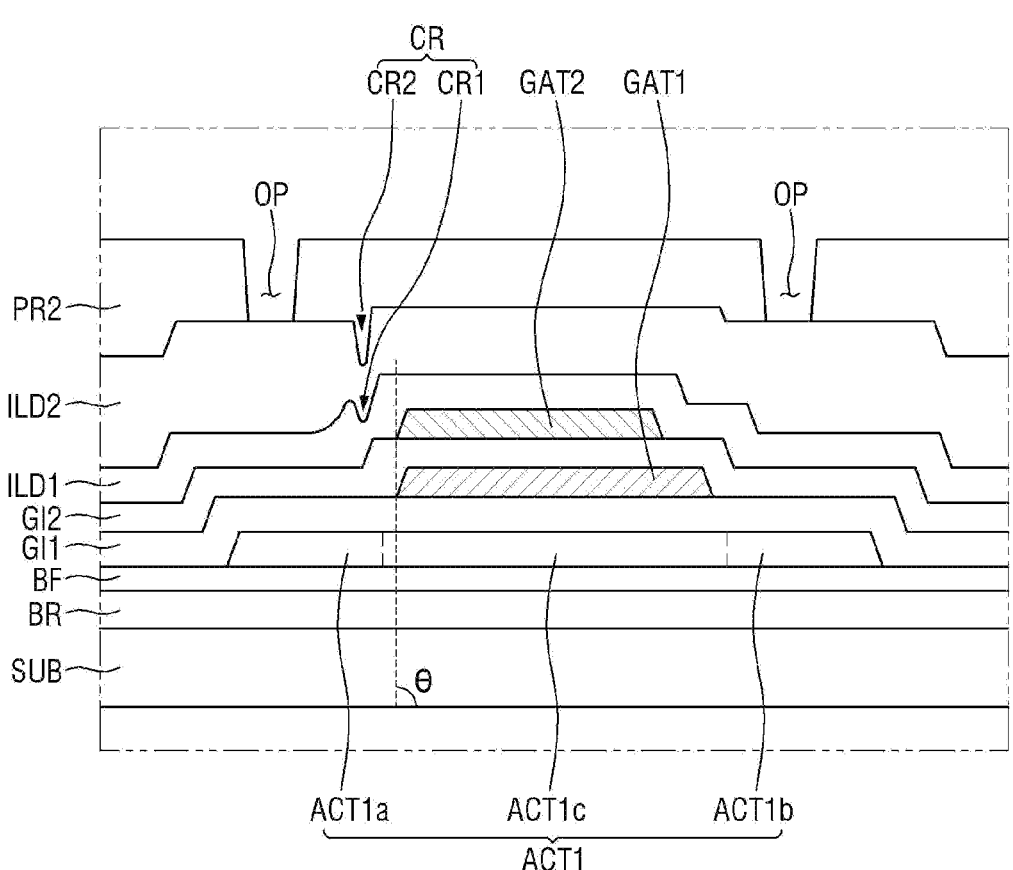
Figure 17:
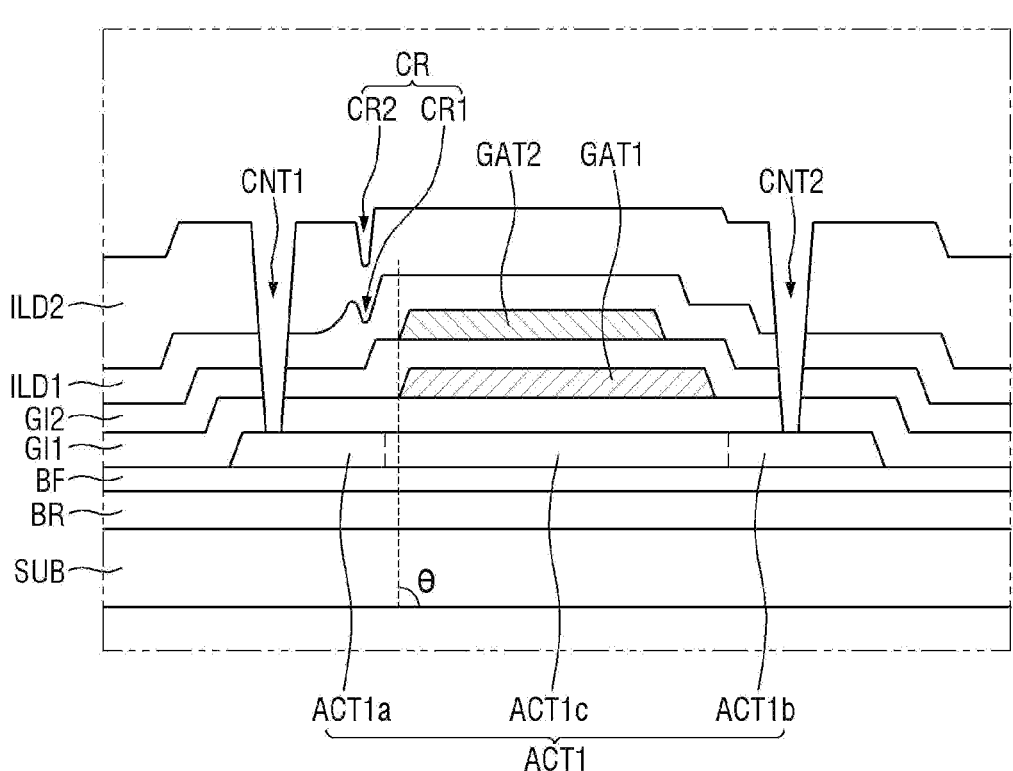

In an embodiment, the photoresist layer PR1 may contain a positive photoresist material. FIG. 16 illustrates the photoresist pattern PR2 resulting from the development process when using the photoresist layer PR1 containing a positive photoresist material, but the disclosure is not limited thereto. The target substrate TS may include the photoresist layer PR1 containing a negative photoresist material, and thus include the photoresist pattern PR2 in which the photoresist material remains in a region irradiated with the light L and the photoresist material is removed in a region not irradiated with the light L.

In an embodiment, openings OP may be formed through the photoresist pattern PR2 by the light exposure process and the development process. The openings OP may be disposed to overlap the first and second contact holes CNT1 and CNT2 which are formed through the subsequent etching process. In such an embodiment, the photoresist pattern PR2 may be a masking pattern of the etching process for forming the first and second contact holes CNT1 and CNT2.

Although not illustrated, after forming the first and second contact holes CNT1 and CNT2, other conductive layers and insulating layers including the first and second source/drain electrodes SD1a and SD1b may be formed to manufacture the display device.

In an embodiment, the photolithography apparatus 1 may include the first vacuum unit 230 for performing a vacuum treatment process which is performed before the photoresist layer PR1 application process. In such an embodiment, before the photoresist layer PR1 application process using the first vacuum unit 230, the photolithography apparatus 1 may effectively remove the foreign substances such as the moisture MS disposed in the crack CR of the insulating layer disposed around two conductive layers arranged to overlap so that at least one edge thereof is aligned. Through this process, the outgassing phenomenon which may occur in the vacuum treatment process of the photoresist layer PR1 curing process may be prevented, thereby improving the completeness of the photolithography process.

Figure 18:
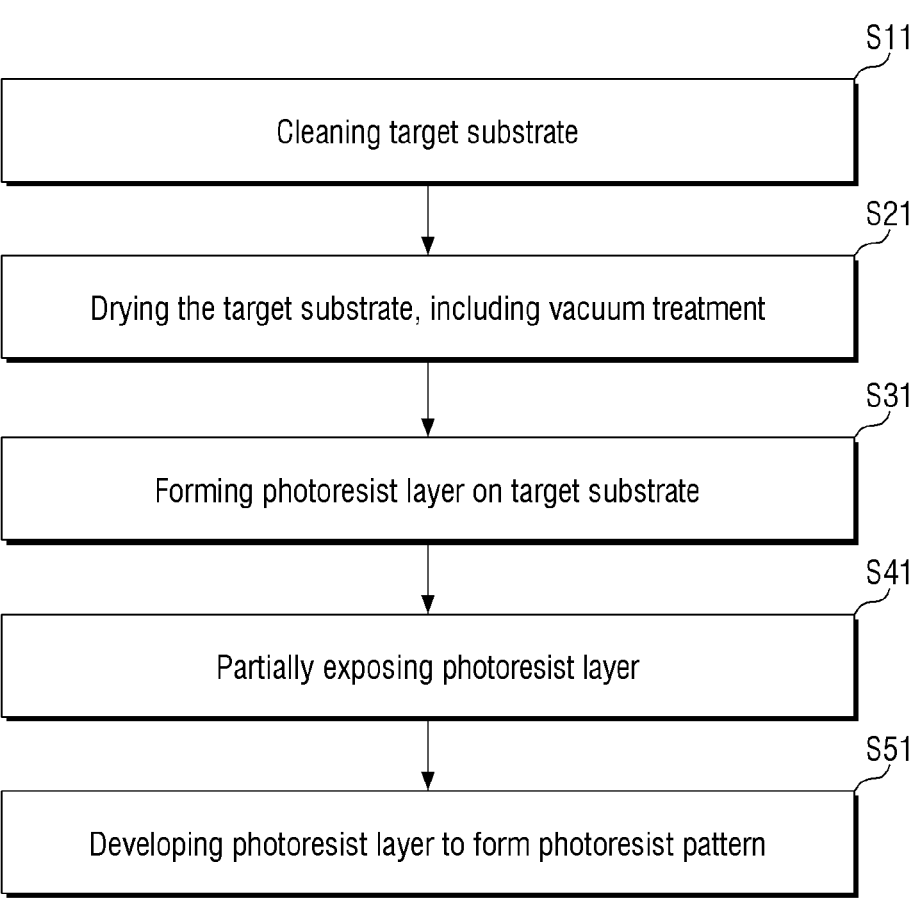
FIG. 18 is a flowchart of a method for forming a photoresist pattern according to an embodiment.

FIG. 18 is a flowchart of a method for forming a photoresist pattern according to an embodiment.

Referring to FIG. 18, an embodiment of a method for forming a photoresist pattern may include a cleaning a target substrate (S11), drying the target substrate (S21), which includes performing a vacuum treatment, forming a photoresist layer on the target substrate (S31), partially exposing the photoresist layer (S41), and developing the photoresist layer to form the photoresist pattern (S51).

In such an embodiment, cleaning the target substrate may be performed as described above.

As described above with reference to FIGS. 5 to 13, the cleaning unit 100 may clean the target substrate TS before the photoresist coating.

The cleaning unit 100 may include the cleaning solution sprayer 110 and the air sprayer 120. After performing a cleaning solution WT spraying process through the cleaning solution sprayer 110, the target substrate TS may be subjected to an air spraying process through the air sprayer 120.

In such an embodiment, drying the target substrate, which includes performing the vacuum treatment, may be performed. The drying the target substrate may be performed by the drying unit 200.

The drying unit 200 may remove the remaining liquid on the target substrate TS processed by the cleaning unit 100. The drying unit 200 may include the first heating unit 210, the first cooling unit 220, and the first vacuum unit 230. In an embodiment, the drying unit 200 included in the photolithography apparatus 1 may be configured in a way such that the target substrate TS is processed by the first heating unit 210, the first cooling unit 220, and the first vacuum unit 230 in a sequential order.

The first heating unit 210 may heat the target substrate TS to remove the moisture MS remaining on the target substrate TS. The first cooling unit 220 may lower the temperature of the heated target substrate TS.

Most of the moisture MS disposed on the second interlayer insulating layer ILD2 may be removed from the target substrate TS that has passed through the first heating unit 210 and the first cooling unit 220. However, the moisture MS disposed in the second crack CR2 may still be retained without being removed even after passing the first heating unit 210 and the first cooling unit 220. In such an embodiment, the first vacuum unit 230 may be employed to remove the moisture MS disposed in the second crack CR2 even after passing through the first heating unit 210 and the first cooling unit 220.

The first vacuum unit 230 may discharge and remove the moisture MS disposed in the crack CR of the target substrate TS to the outside. In an embodiment, the moisture MS disposed in the crack CR may be discharged to the outside and be removed by using the first vacuum pump 233 to provide a negative pressure to the first vacuum chamber 232.

In such an embodiment, forming the photoresist layer may be performed on the target substrate. Referring to FIG.

14, foreign substances such as the moisture MS may not exist on the target substrate TS in a state before formation of the photoresist layer PR1. The photoresist layer PR1 formed on the target substrate TS may include a positive photoresist material, but is not limited thereto and may include a negative photoresist material. The forming the photoresist layer PR1 may be performed by the coating unit 300.

In such an embodiment, partially exposing the photoresist layer may be performed. Referring to FIG. 15, the light L may be radiated onto a region not covered by the mask MK in the photoresist layer PR1. When a material included in the photoresist layer PR1 is a positive photoresist material, the light L is radiated onto a region where subsequent etching is performed, and when a material included in the photoresist layer PR1 is a negative photoresist material, the light L is radiated onto a region where subsequent etching is not performed. The partially exposing the photoresist layer PR1 may be performed by the exposure unit 500.

In such an embodiment, the developing the photoresist layer to form the photoresist pattern may be performed. The photoresist layer PR1 on which the exposure process has been performed may be changed into the photoresist pattern PR2 through the developing process. In an embodiment, for example, the development process of the photoresist layer PR1 may be performed by using the developing solution, but is not limited thereto. The photoresist pattern PR2 formed through this process may serve as a masking pattern in the subsequent etching process. In an embodiment, for example, the photoresist pattern PR2 may serve as a masking pattern in an etching process for forming the first contact hole CNT1 and the second contact hole CNT2 illustrated in FIG. 2 and FIG. 3.

According to an embodiment of the method for forming a photoresist pattern, the vacuum treatment process which is performed before the photoresist layer PR1 application process may be performed. In such an embodiment of the method for forming a photoresist pattern, before the photoresist layer PR1 application process, the vacuum treatment process may be performed, thereby effectively removing the foreign substances such as the moisture MS disposed in the crack CR of the insulating layer disposed around two conductive layers arranged to overlap each other so that at least one edge thereof is aligned. Through this process, the outgassing phenomenon which may occur in the vacuum treatment process of the photoresist layer PR1 curing process may be prevented, thereby improving the completeness of the photolithography process.

Hereinafter, alternative embodiments of the photolithography apparatus 1 will be described. The following description of the photolithography apparatus according to alternative embodiments will focus on differences, while omitting any repetitive detailed description of the same or like elements of photolithography apparatus 1 as those described above.

Figure 19:
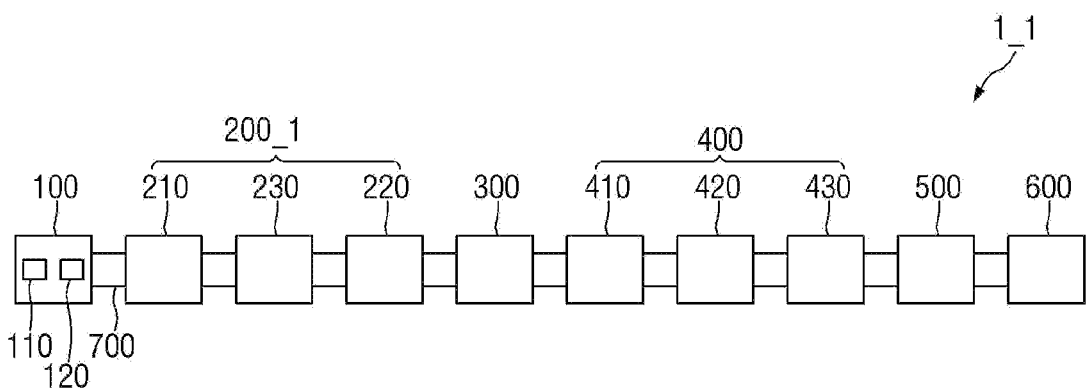
FIG. 19 is a schematic view of a photolithography apparatus according to an alternative embodiment.

FIG. 19 is a schematic view of a photolithography apparatus according to an alternative embodiment.

Referring to FIG. 19, an embodiment of a photolithography apparatus 1_1 of FIG. 19 may be substantially the same as the embodiments of the photolithography apparatus 1 described above except for a drying unit 200_1 which has a different configuration. In such an embodiment, the drying unit 200_1 included in the photolithography apparatus 1_1 may be configured in a way such that the target substrate TS is processed by the first heating unit 210, the first vacuum unit 230, and the first cooling unit 220 in a sequential order. In such an embodiment, the target substrate TS which is processed by the photolithography apparatus 1_1 may pass through the cleaning unit 100, be heated by the first heating unit 210, be subjected to the vacuum treatment process by the first vacuum unit 230, and then be cooled by the first cooling unit 220. In such an embodiment of the photolithography apparatus 1_1, the first vacuum unit 230 may be disposed between the first heating unit 210 and the first cooling unit 220.

In such an embodiment, the photolithography apparatus 1_1 may include the first vacuum unit 230 that performs a vacuum treatment process which is performed before the photoresist layer PR1 application process. In such an embodiment, before the photoresist layer PR1 application process using the first vacuum unit 230, the photolithography apparatus 1 may effectively remove the foreign substances such as the moisture MS disposed in the crack CR of the insulating layer disposed around two conductive layers arranged to overlap so that at least one edge thereof is aligned. Through this process, the outgassing phenomenon which may occur in the vacuum treatment process of the photoresist layer PR1 curing process may be prevented, thereby improving the completeness of the photolithography process.

In such an embodiment of the photolithography apparatus 1_1, in the process of drying the target substrate TS using the drying unit 200_1 after cleaning using the cleaning unit 100, the target substrate TS may be heated by the first heating unit 210, then vacuum treated by the first vacuum unit 230, and then cooled by the first cooling unit 220. Through this process, by performing the vacuum treatment on the target substrate TS whose temperature has been raised by heating using the first heating unit 210, the moisture MS disposed in the crack CR may be discharged to the outside and effectively evaporated.

Figure 20:
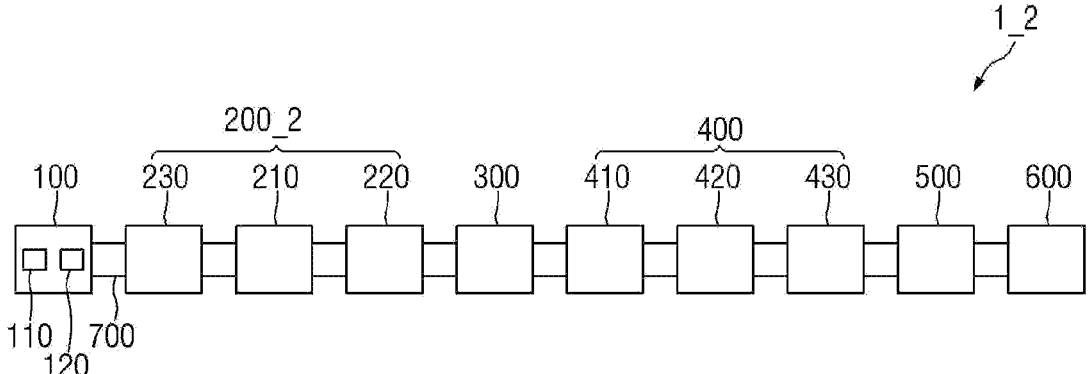
FIG. 20 is a schematic view of a photolithography apparatus according to another alternative embodiment.

FIG. 20 is a schematic view of a photolithography apparatus according to another alternative embodiment.

Referring to FIG. 20, an embodiment of a photolithography apparatus 1_2 of FIG. 20o may be substantially the same as the photolithography apparatus 1 described above except for a drying unit 200_2 which has a different configuration. In such an embodiment, the drying unit 200_2 included in the photolithography apparatus 1_2 may be configured in a way such that the target substrate TS is processed by the first vacuum unit 230, the first heating unit 210 and the first cooling unit 220 in a sequential order. In such an embodiment, the target substrate TS which is processed by the photolithography apparatus 1_2 may pass through the cleaning unit 100, be vacuum treated by the first vacuum unit 230, be heated by the first heating unit 210, and then be cooled by the first cooling unit 220. In such an embodiment of the photolithography apparatus 1_2, the first vacuum unit 230 may be disposed between the cleaning unit 100 and the first heating unit 210.

In such an embodiment, the photolithography apparatus 1_2 may include the first vacuum unit 230 that performs a vacuum treatment process which is performed before the photoresist layer PR1 application process. In such an embodiment, before the photoresist layer PR1 application process using the first vacuum unit 230, the photolithography apparatus 1 may effectively remove the foreign substances such as the moisture MS disposed in the crack CR of the insulating layer disposed around two conductive layers arranged to overlap so that at least one edge thereof is aligned. Through this process, the outgassing phenomenon which may occur in the vacuum treatment process of the photoresist layer PR1 curing process may be prevented, thereby improving the completeness of the photolithography process.

In such an embodiment of the photolithography apparatus 1_2, in the process of drying the target substrate TS using the drying unit 200_2 after cleaning using the cleaning unit 100, the target substrate TS may be heated by the first heating unit 210 after discharging the moisture MS disposed in the crack CR to the outside by the first vacuum unit 230, and cooled by the first cooling unit 220. Through this process, the moisture MS may be effectively removed by discharging the moisture MS disposed in the crack CR to the outside and then performing the drying process using the first heating unit 210 and the first cooling unit 220.

Figure 21:
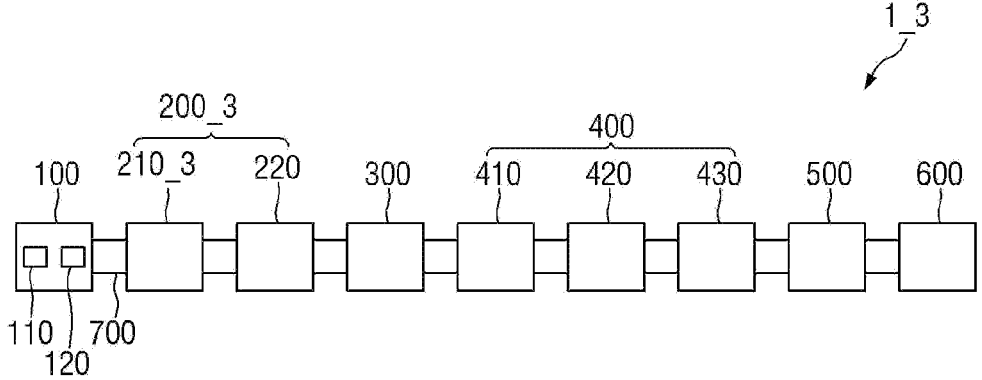
FIG. 21 is a schematic view of a photolithography apparatus according to still another alternative embodiment.
Figure 22:
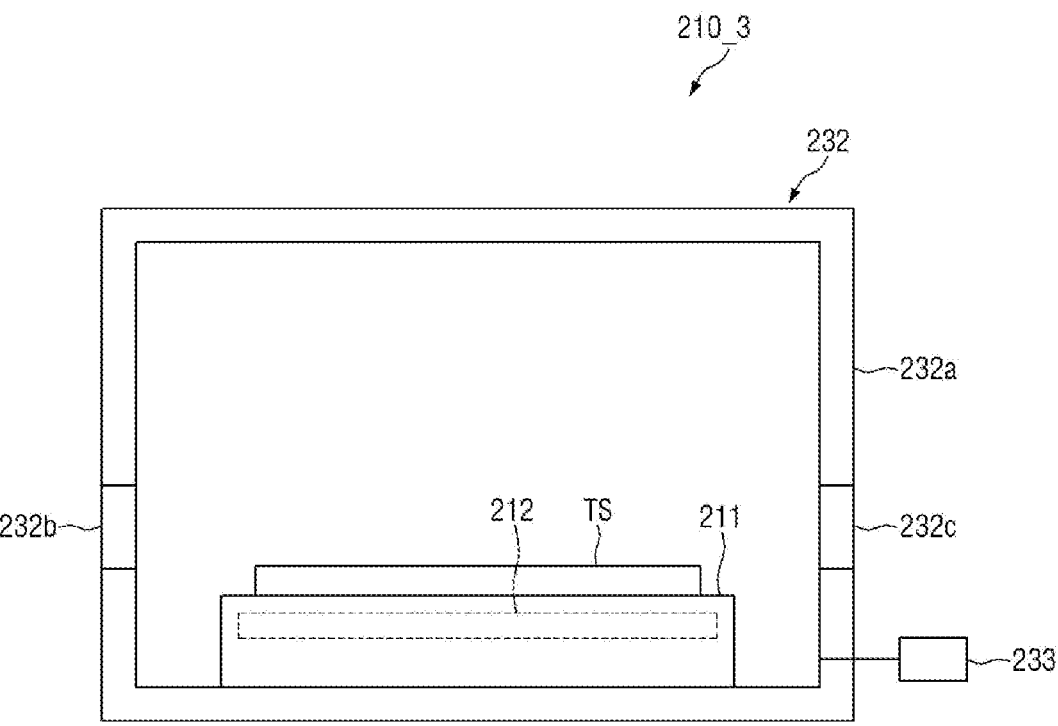
FIG. 22 is a schematic view of a first heating unit according to an alternative embodiment.

FIG. 21 is a schematic view of a photolithography apparatus according to still another alternative embodiment. FIG. 22 is a schematic view of a first heating unit according to an alternative embodiment.

Referring to FIGS. 21 and 22, an embodiment of a photolithography apparatus 1_3 shown in FIGS. 21 and 22 is substantially the same as the embodiments of the photolithography apparatus 1 described above except for a drying unit 200_3, which has a different configuration. In such an embodiment, the drying unit 200_3 included in the photolithography apparatus 1_3 may be configured in a way such that the target substrate TS may be processed by a first heating unit 210_3 and the first cooling unit 220 in a sequential order. In such an embodiment, the target substrate TS which is processed by the photolithography apparatus 1_3 according to the embodiment may pass through the cleaning unit 100, be heated by the first heating unit 210_3 and then be cooled by the first cooling unit 220.

In such an embodiment, the first heating unit 210_3 may include a vacuum chamber and a vacuum pump as illustrated in FIG. 22. In such an embodiment, the first heating unit 210_3 may include a first heating stage unit, the first heater 212 disposed inside the first heating stage unit and a first heating chamber including an inner space in which the first heating stage unit is disposed. In such an embodiment, the first heating stage unit and the first heater 212 may have substantially the same configuration as the first heating unit 210_3 described above with reference to FIG. 9. In such an embodiment, the first heating chamber of the embodiment may have substantially the same configuration as the first vacuum chamber 232 described above with reference to FIG. 12.

In an embodiment of the photolithography apparatus 1_3, the drying unit 200_3 may be heated and vacuum treated at the same time through the first heating unit 210_3.

In an embodiment, the photolithography apparatus 1_3 may include the first heating unit 210_3 that performs the vacuum treatment process which is performed before the photoresist layer PR1 application process. In such an embodiment, before the photoresist layer PR1 application process using the first vacuum unit 230, the photolithography apparatus 1 may effectively remove the foreign substances such as the moisture MS disposed in the crack CR of the insulating layer disposed around two conductive layers arranged to overlap so that at least one edge thereof is aligned. Through this process, the outgassing phenomenon which may occur in the vacuum treatment process of the photoresist layer PR1 curing process may be prevented, thereby improving the completeness of the photolithography process.

In such an embodiment, the photolithography apparatus 1_3 may simplify the process by performing the heating and the vacuum treatment process at the same time through the first heating unit 210_3 before the photoresist layer PR1 application.

Figure 23:
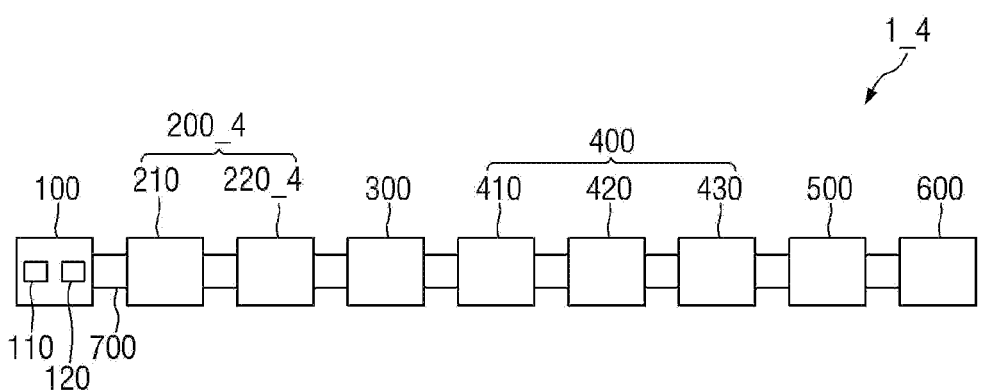
FIG. 23 is a schematic view of a photolithography apparatus according to still another alternative embodiment.
Figure 24:
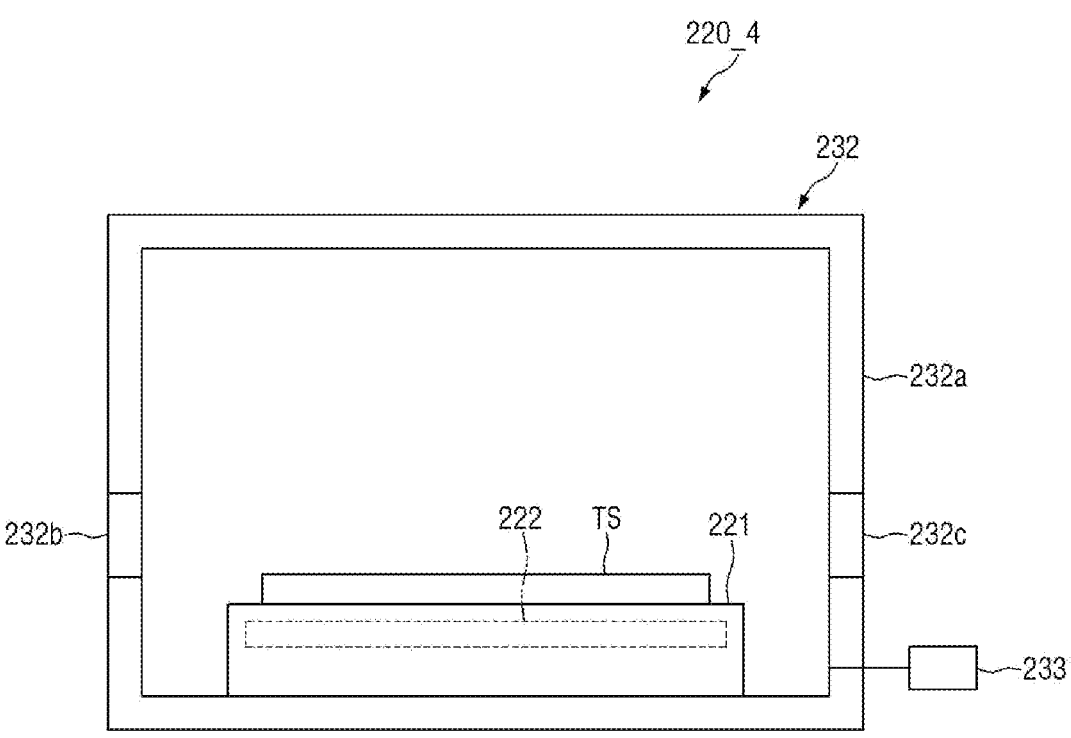
FIG. 24 is a schematic view of a first cooling unit according to another alternative embodiment.

FIG. 23 is a schematic view of a photolithography apparatus according to still another alternative embodiment. FIG. 24 is a schematic view of a first cooling unit according to another alternative embodiment.

Referring to FIGS. 23 and 24, an embodiment of the photolithography apparatus 1_4 shown in FIGS. 23 and 24 may be substantially the same as the embodiments of the photolithography apparatus 1 described above except for a drying unit 200_4 which has a different configuration. In such an embodiment, the drying unit 200_4 included in the photolithography apparatus 1_4 may be configured in a way such that the target substrate TS may be processed by the first heating unit 210 and a first cooling unit 220_4 in a sequential order. In such an embodiment, the target substrate TS which is processed by the photolithography apparatus 1_4 may pass through the cleaning unit 100, be heated by the first heating unit 210 and then be cooled by the first cooling unit 220_4.

In such an embodiment, the first cooling unit 220_4 may include a vacuum chamber and a vacuum pump as illustrated in FIG. 24. In such an embodiment, the first cooling unit 220_4 may include a first cooling stage unit, the first cooler 222 disposed inside the first cooling stage unit and the first cooling chamber including an inner space in which the first cooling stage unit is disposed. In such an embodiment, the first cooling stage unit and the first cooler 222 may have substantially the same configuration as the first cooling unit 220_4 described above with reference to FIG. 10. In such an embodiment, the first cooling chamber according to the embodiment may have substantially the same configuration as the first vacuum chamber 232 described above with reference to FIG. 12.

In an embodiment of the photolithography apparatus 1_4, the drying unit 200_4 may be heated and vacuum treated at the same time through the first cooling unit 220_4.

In such an embodiment, the photolithography apparatus 1_4 may include the first cooling unit 220_4 that performs the vacuum treatment process which is performed before the photoresist layer PR1 application process. In such an embodiment, before the photoresist layer PR1 application process using the first vacuum unit 230, the photolithography apparatus 1 may effectively remove the foreign substances such as the moisture MS disposed in the crack CR of the insulating layer disposed around two conductive layers arranged to overlap so that at least one edge thereof is aligned. Through this process, the outgassing phenomenon which may occur in the vacuum treatment process of the photoresist layer PR1 curing process may be prevented, thereby improving the completeness of the photolithography process.

In such an embodiment, the photolithography apparatus 1_4 may simplify the process by performing the heating and the vacuum treatment process at the same time through the first cooling unit 220_4 before the photoresist layer PR1 application.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A photolithography apparatus comprising:

a cleaning unit which cleans a target substrate;

a drying unit which dries the target substrate provided from the cleaning unit; and a coating unit which forms a photoresist layer by coating a photoresist on the target substrate provided from the drying unit, wherein the drying unit includes a first vacuum unit which performs a vacuum treatment to remove liquid remaining on the target substrate after the target substrate is cleaned by the cleaning unit and before the target substrate is provided to the coating unit.

2. The photolithography apparatus of claim 1, wherein the drying unit further includes a first heating unit which heats the target substrate and a first cooling unit which cools the target substrate heated by the first heating unit.

3. The photolithography apparatus of claim 2, wherein the first vacuum unit is disposed between the first cooling unit and the coating unit.

4. The photolithography apparatus of claim 2, wherein the first vacuum unit is disposed between the first heating unit and the first cooling unit.

5. The photolithography apparatus of claim 2, wherein the first vacuum unit is disposed between the cleaning unit and the first heating unit.

6. The photolithography apparatus of claim 2, further comprising:

a curing unit which cures the photoresist layer of the target substrate provided from the coating unit;

an exposure unit which radiates light after disposing a mask on the photoresist layer of the target substrate provided from the curing unit; and a developing unit which forms a photoresist pattern by developing the photoresist layer of the target substrate provided from the exposure unit.

7. The photolithography apparatus of claim 6, wherein the curing unit includes a second vacuum unit which performs a vacuum treatment on the target substrate, a second heating unit which heats the target substrate provided from the second vacuum unit, and a second heating unit which cools the target substrate provided from the second heating unit.

8. The photolithography apparatus of claim 1, wherein the first vacuum unit includes a chamber, a stage disposed inside the chamber, and a vacuum pump which provides a negative pressure to an inner space of the chamber.

9. The photolithography apparatus of claim 8, wherein the first vacuum unit further includes a heater coupled to the stage.

10. The photolithography apparatus of claim 8, wherein the first vacuum unit further includes a cooler coupled to the stage.

11. The photolithography apparatus of claim 1, wherein the cleaning unit includes a cleaning solution sprayer which sprays a cleaning solution onto the target substrate, and an air sprayer which sprays air onto the target substrate provided from the cleaning solution sprayer.

12. The photolithography apparatus of claim 1, wherein the target substrate includes:

a base substrate;

a first conductive layer disposed on the base substrate;

a first insulating layer disposed on the first conductive layer; and a second conductive layer disposed on the first insulating layer and overlapping the first conductive layer, wherein an edge of the first conductive layer and an edge of the second conductive layer are aligned with each other.

13. The photolithography apparatus of claim 12, wherein the target substrate further includes a second insulating layer disposed on the second conductive layer, wherein the second insulating layer includes a crack disposed adjacent to the edge of the first conductive layer and the edge of the second conductive layer, which are aligned with each other.

14. The photolithography apparatus of claim 12, wherein an alignment angle between one surface of the base substrate and an imaginary line connecting the edge of the first conductive layer and the edge of the second conductive layer, which are aligned with each other, in the target substrate is in a range of about 80° to about 100°.

15. A method of forming a photoresist pattern, the method comprising:

cleaning a target substrate;

drying the target substrate; and forming a photoresist layer by applying a photoresist on the target substrate, wherein the drying the target substrate comprises performing a vacuum treatment to remove liquid remaining on the target substrate after the cleaning the target substrate and before the forming the photoresist layer by applying the photoresist on the target substrate.

16. The method of claim 15, wherein the drying the target substrate further comprises heating the target substrate, wherein the heating the target substrate is performed before the performing the vacuum treatment on the target substrate.

17. The method of claim 15, wherein the drying the target substrate further comprises heating the target substrate, wherein the heating the target substrate is performed after the performing the vacuum treatment on the target substrate.

18. The method of claim 15, further comprising:

after the forming the photoresist layer on the target substrate, curing the photoresist layer;

radiating light after disposing a mask on the photoresist layer; and developing the photoresist layer to form a photoresist pattern.

19. The method of claim 15, wherein the target substrate includes:

a base substrate;

a first conductive layer disposed on the base substrate;

a first insulating layer disposed on the first conductive layer; and a second conductive layer disposed on the first insulating layer and overlapping the first conductive layer, wherein an edge of the first conductive layer and an edge of the second conductive layer are aligned with each other.

20. The method of claim 19, wherein the target substrate further includes a second insulating layer disposed on the second conductive layer, wherein the second insulating layer includes a crack disposed adjacent to the edge of the first conductive layer and the edge of the second conductive layer, which are aligned with each other.

* * * * *